(12) United States Patent
Tirukkonda et al.

(10) Patent No.: US 11,450,687 B2
(45) Date of Patent: Sep. 20, 2022

(54) MULTIBIT FERROELECTRIC MEMORY CELLS AND METHODS FOR FORMING THE SAME

(71) Applicant: SANDISK TECHNOLOGIES LLC, Addison, TX (US)

(72) Inventors: Roshan Tirukkonda, Milpitas, CA (US); Ramy Nashed Bassely Said, San Jose, CA (US); Senaka Kanakamedala, San Jose, CA (US); Rahul Sharangpani, Fremont, CA (US); Raghuveer S. Makala, Campbell, CA (US); Adarsh Rajashekhar, Santa Clara, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/122,360

(22) Filed: Dec. 15, 2020

(65) Prior Publication Data

US 2022/0189993 A1 Jun. 16, 2022

(51) Int. Cl.

| | |
|---|---|
| *H01L 27/11597* | (2017.01) |
| *H01L 27/1159* | (2017.01) |
| *H01L 27/11587* | (2017.01) |
| *H01L 27/11585* | (2017.01) |
| *H01L 27/11578* | (2017.01) |

(52) U.S. Cl.
CPC .... *H01L 27/11597* (2013.01); *H01L 27/1159* (2013.01); *H01L 27/11578* (2013.01); *H01L 27/11585* (2013.01); *H01L 27/11587* (2013.01)

(58) Field of Classification Search
CPC .......... H01L 27/11578; H01L 27/1158; H01L 27/11585; H01L 27/1159; H01L 27/11597
See application file for complete search history.

(56) References Cited

U.S. PATENT DOCUMENTS

| | | | |
|---|---|---|---|
| 9,685,215 B1 * | 6/2017 | Kang | ..................... H01L 43/00 |
| 10,068,630 B2 | 9/2018 | Park et al. | |
| 10,395,716 B2 | 8/2019 | Kawamura | |

(Continued)

OTHER PUBLICATIONS

Notification of Transmittal of the International Search Report and the Written Opinion of the International Searching Authority for International Patent Application No. PCT/US2021/036868, dated Oct. 18, 2021, 10 pages.

(Continued)

*Primary Examiner* — Matthew E Warren
(74) *Attorney, Agent, or Firm* — The Marbury Law Group PLLC

(57) ABSTRACT

A three-dimensional memory device includes an alternating stack of insulating layers and electrically conductive layers and memory stack structures vertically extending through the alternating stack. Each of the memory stack structures includes a vertical semiconductor channel and a vertical stack of ferroelectric memory elements surrounding the vertical semiconductor channel and located at levels of the electrically conductive layers. Each of the ferroelectric memory elements includes a respective vertical stack of a first ferroelectric material portion and a second ferroelectric material portion that differs from the first ferroelectric material portion by at least one of a material composition and a lateral thickness.

24 Claims, 33 Drawing Sheets

(56) References Cited

U.S. PATENT DOCUMENTS

| | | | |
|---|---|---|---|
| 10,700,093 | B1 | 6/2020 | Kalitsov et al. |
| 10,811,431 | B1 | 10/2020 | Makala et al. |
| 10,833,101 | B2 | 11/2020 | Shimomura et al. |
| 10,868,042 | B1 * | 12/2020 | Zhang ............... H01L 27/11587 |
| 2014/0087534 | A1 | 3/2014 | Choe et al. |
| 2018/0082729 | A1 | 3/2018 | Slesazeck et al. |
| 2020/0066868 | A1 | 2/2020 | Ino et al. |
| 2020/0365618 | A1 | 11/2020 | Zhang et al. |

OTHER PUBLICATIONS

Amiri, M.H. et al., "Designing Multi-Level Resistance States in Graphene Ferroelectric Transistors,". *Advanced Functional Materials*, vol. 30, No. 34, (2020); https://doi.org/10.1002/adfm.202003085.

Conley, J. et al., "Electrical properties of HfO2 deposited via atomic layer deposition using Hf(NO3)4 and H2Ov,". Applied Physics Letters. vol. 82, No. 20, pp. 3508-3510, (2003); https://doi.org/10.1063/1.1575934.

Endoh et al., "Novel Ultra High Density Memory with a Stacked-Surrounding Gate Transistor (S-SGT) Structured Cell," IEDM Proc. (2001) 33-36.

Khan, M.A. et al., "Hybrid dual gate ferroelectric memory for multilevel information storage," Organic Electronics, vol. 16, pp. 9-17, ISSN 1566-1199, (2015); https://doi.org/10.1016/j.orgel.2014.10.034.

Kinder, E.W. et al., "Partial switching of ferroelectrics for synaptic weight storage," *2017 75th Annual Device Research Conference (DRC)*, South Bend, IN, pp. 1-2, (2017); https:///doi.org/10.1109/DRC.2017.7999427.

Lomenzo, P.D. et al., "Annealing behavior of ferroelectric Si-doped HfO2," Thin Solid Films, vol. 615, pp. 139-144, (2016); https://doi.org/10.1016/j.tsf.2016.07.009.

MacLeod, T.C. et al., "Design of a Multi-Level/Analog Ferroelectric Memory Device," *Integrated Ferroelectrics*, vol. 89, No. 1, pp. 12-19, (2007); https://doi.org/10.1080/10584580601077435.

Müller, J. et al., "Ferroelectric Hafnium Oxide a Game Changer to FRAM?," *2014 14th Annual Non-Volatile Memory Technology Symposium (NVMTS)*, Jeju Island, 2014, pp. 1-7, (2014); doi: 10.1109/NVMTS.2014.7060838.

Oh, .S. et al., "HfZrOx-Based Ferroelectric Synapse Device With 32 Levels of Conductance States for Neuromorphic Applications," in *IEEE Electron Device Letters*, vol. 38, No. 6, pp. 732-735, Jun. 2017; doi: 10.1109/LED.2017.2698083.

Oh, S. et al., "Ferroelectric materials for neuromorphiccomputing," APL Mater. 7, 091109 (2019); https://doi.org/10.1063/1.5108562.

Rahman, M.M. et al., "Characterization of Al Incorporation into HfO$_2$ Dielectric by Atomic Layer Deposition," *Micromachines* 2019, Vo. 10, No. 6, 361, (2019); https://doi.org/10.3390/mi10060361.

Sasaki, T. , "Highly selective etching of LaAlSiOx to Si using C4 F8 /Ar/H2 plasma," 2015 *Jpn. J. Appl. Phys.* vol. 54, No. 6S2, (2015); http://dx.doi.org/10.7567/JJAP.54.06GB03.

U.S. Appl. No. 16/249,300, filed Jan. 16, 2019, SanDisk Technologies LLC.

U.S. Appl. No. 16/374,330, filed Apr. 3, 2019, SanDisk Technologies LLC.

U.S. Appl. No. 16/412,764, filed May 15, 2019, SanDisk Technologies LLC.

U.S. Appl. No. 16/454,458, filed Jun. 27, 2019, SanDisk Technologies LLC.

U.S. Appl. No. 16/454,475, filed Jun. 27, 2019, SanDisk Technologies LLC.

U.S. Appl. No. 16/456,736, filed Jun. 28, 2019, SanDisk Technologies LLC.

\* cited by examiner

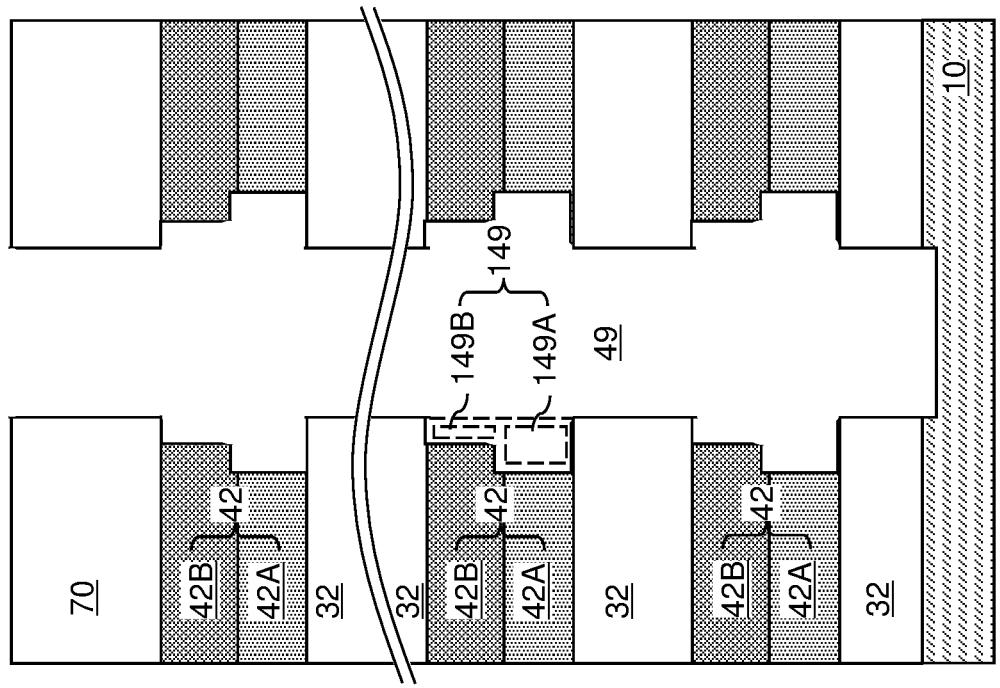
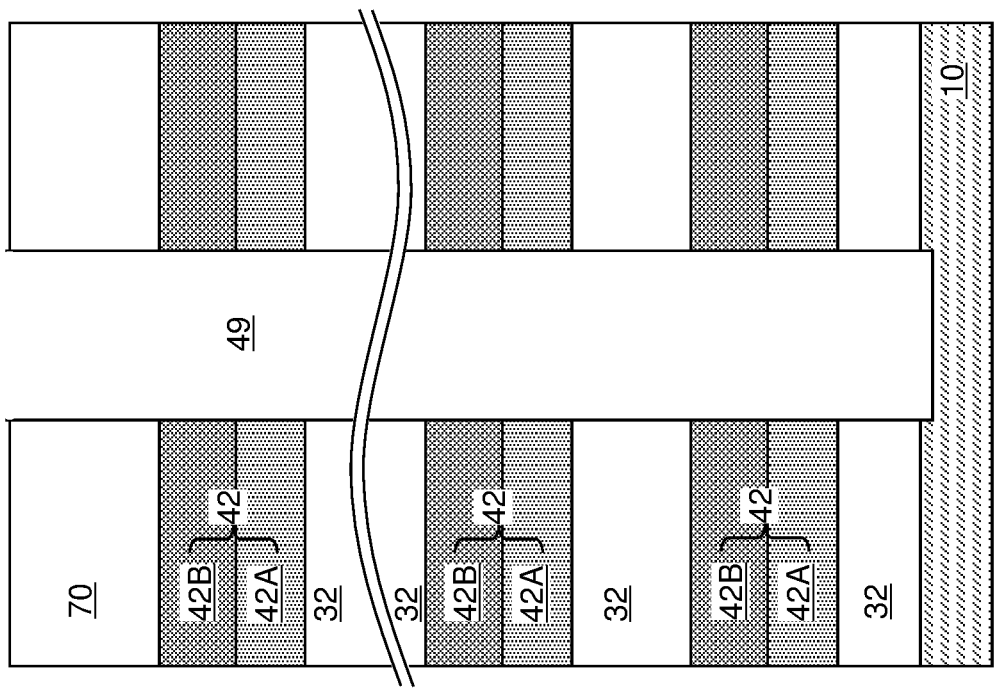

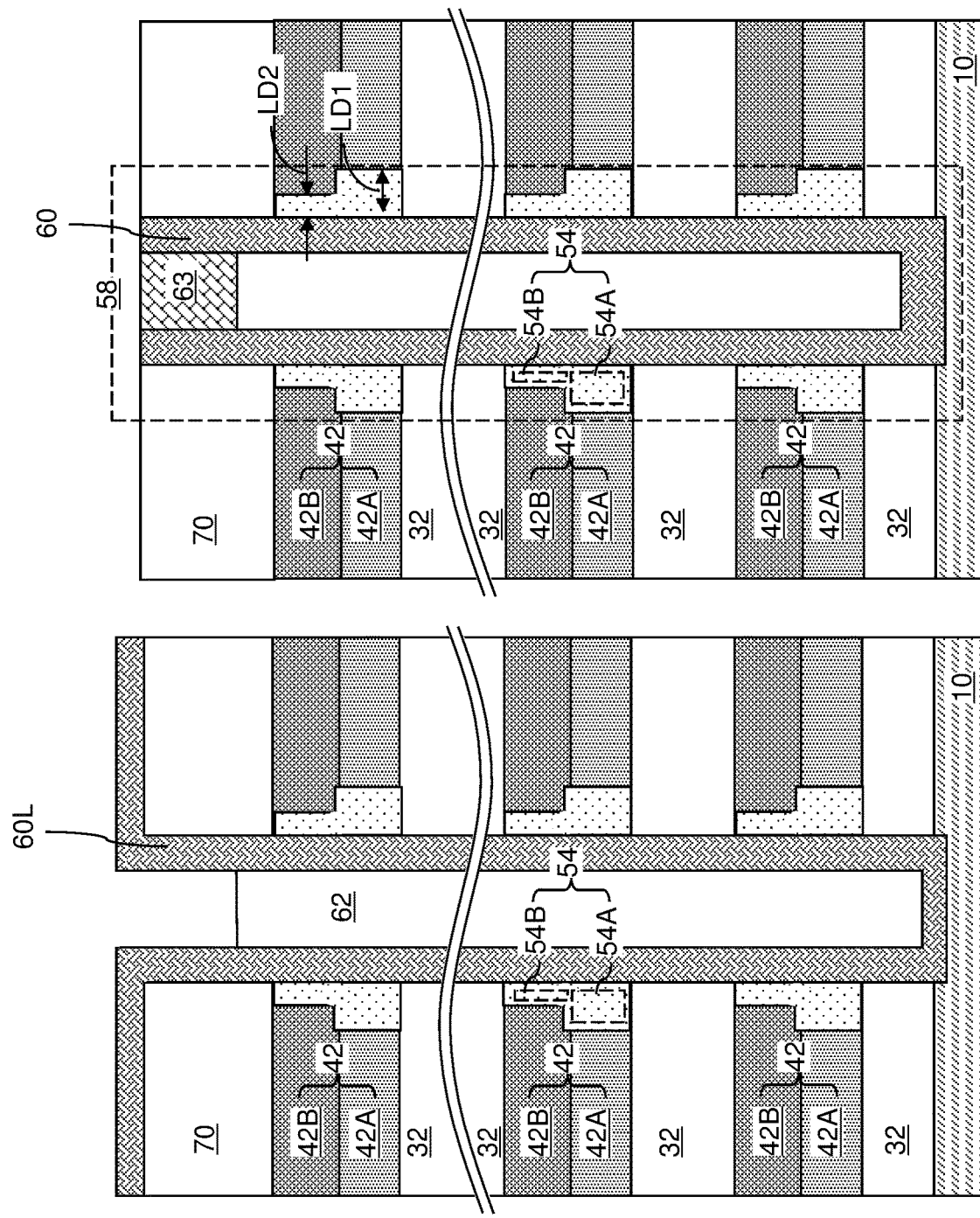

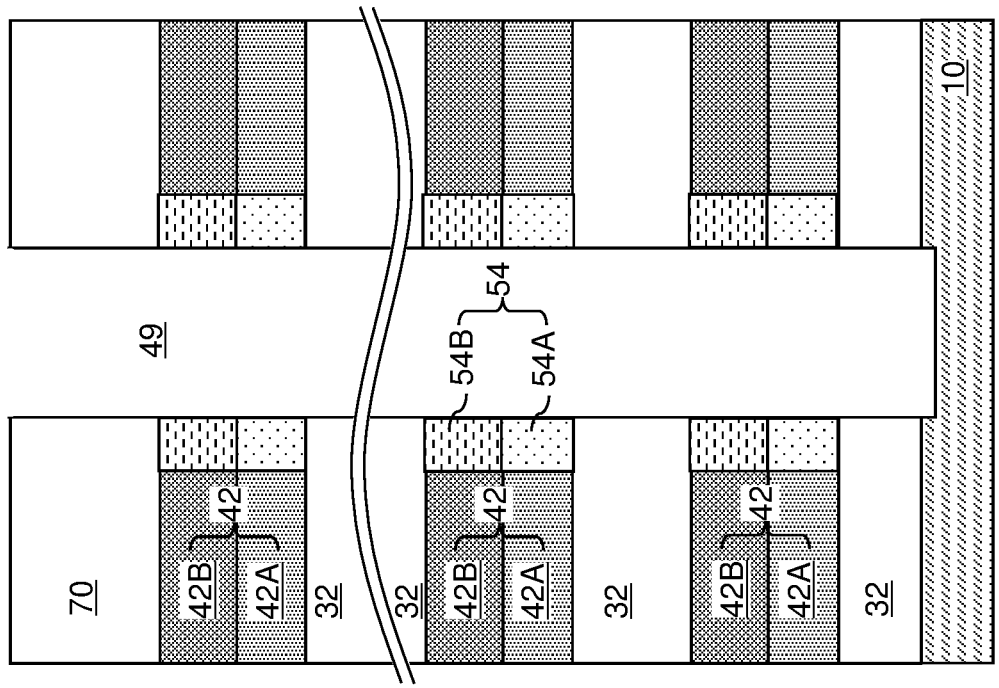
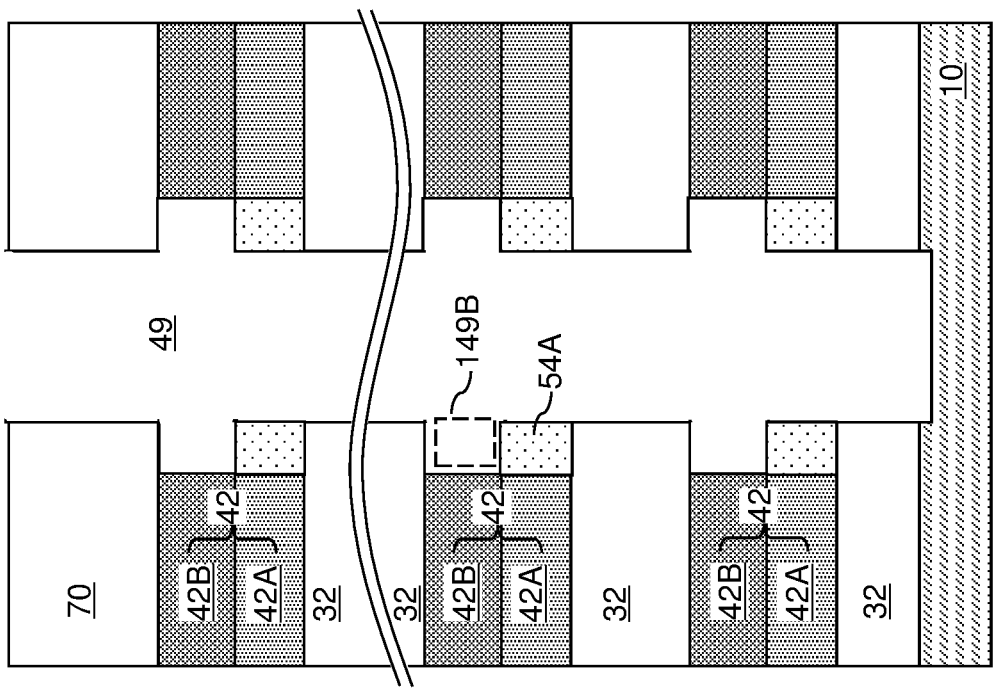

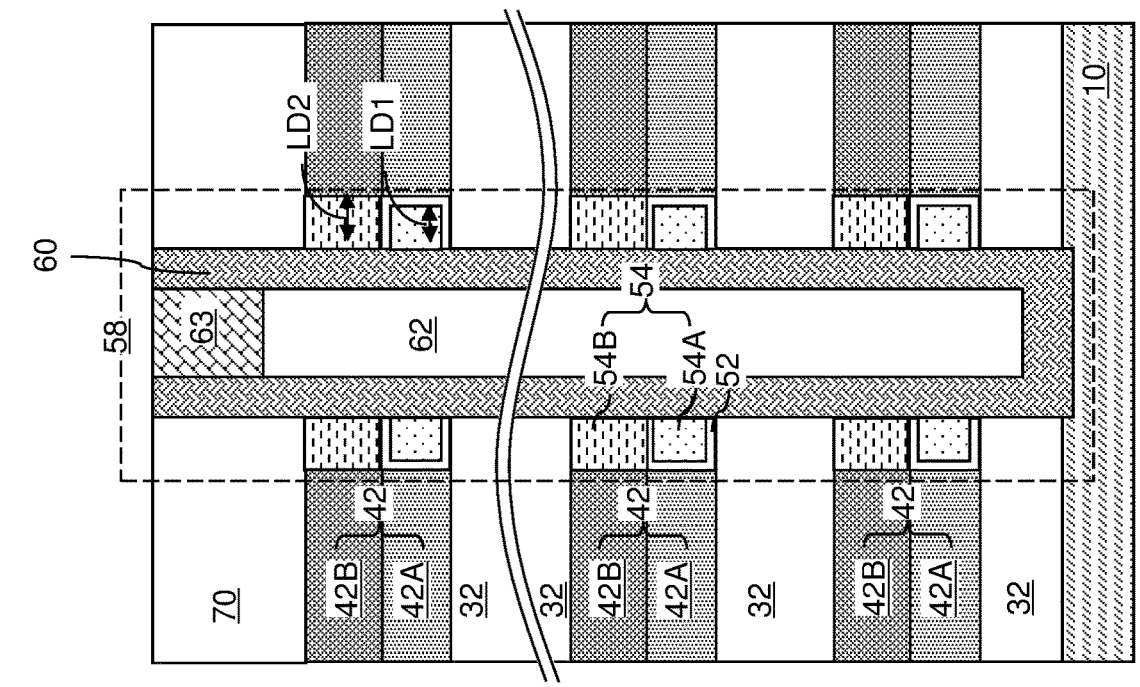
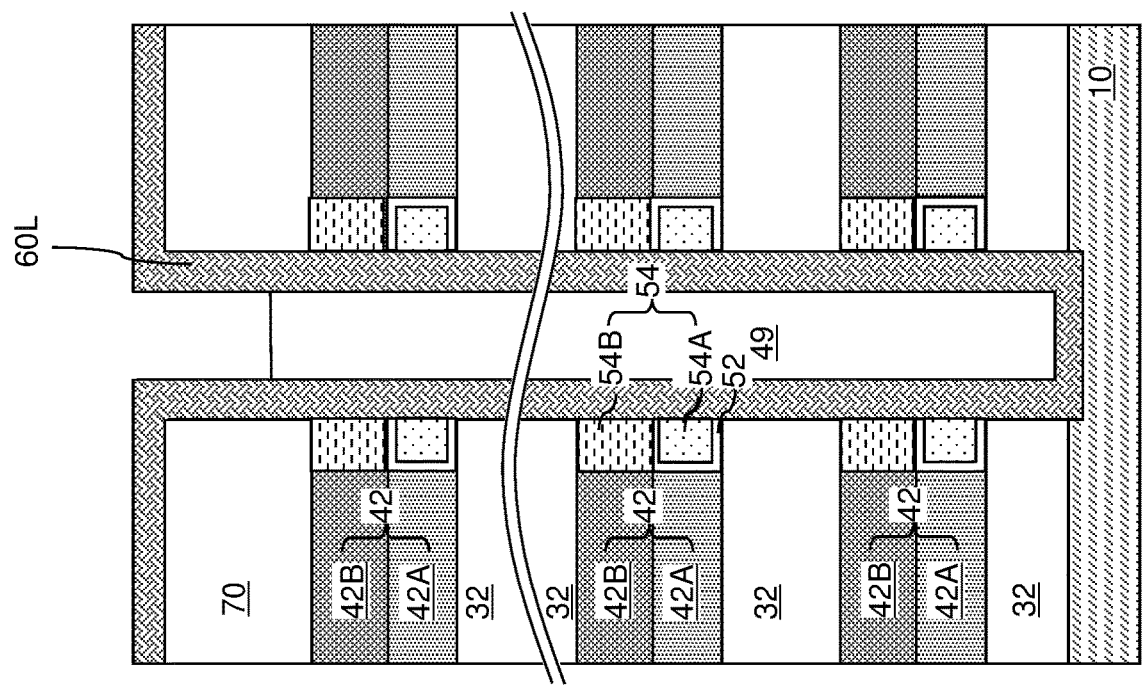

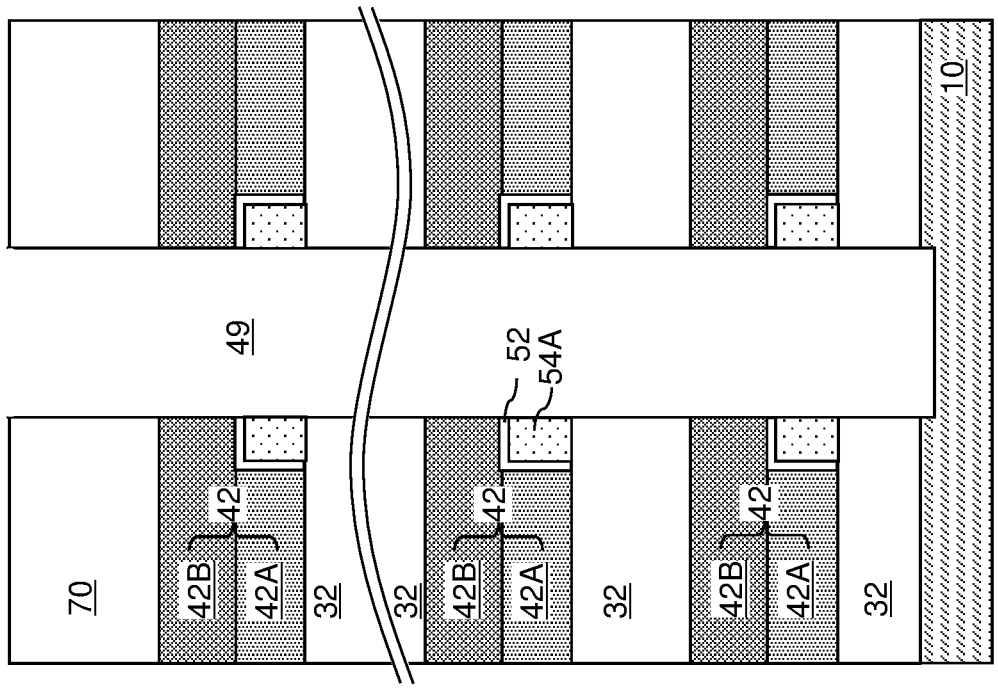
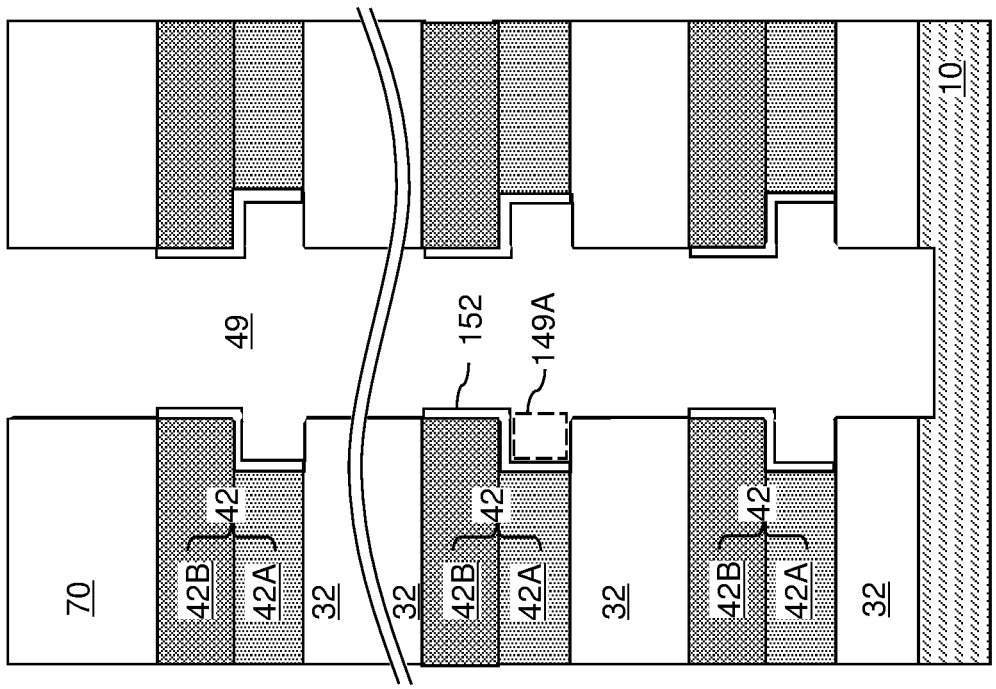
FIG. 9A
FIG. 9B

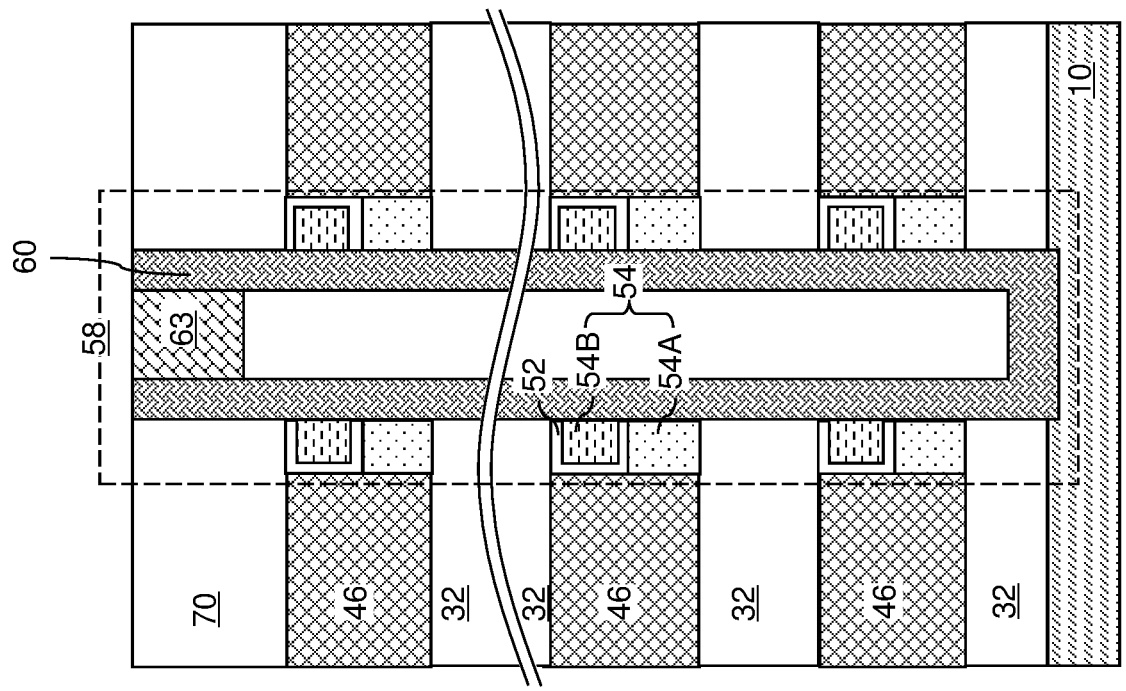
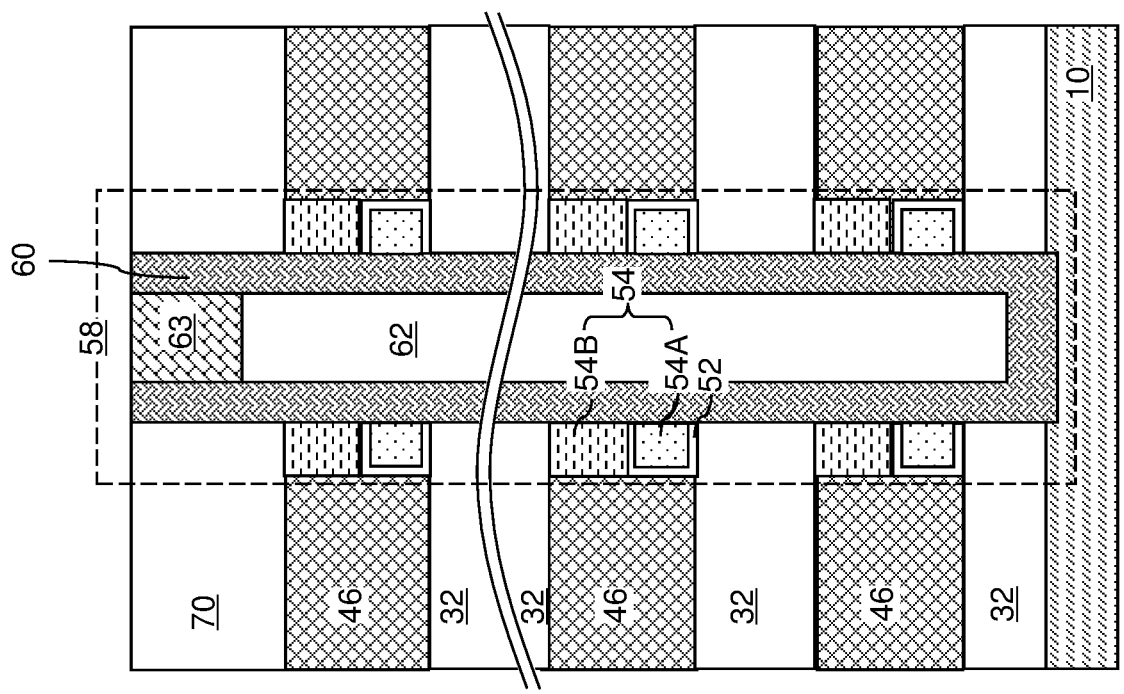

MULTIBIT FERROELECTRIC MEMORY CELLS AND METHODS FOR FORMING THE SAME

FIELD

The present disclosure relates generally to the field of semiconductor devices, and particular to a three-dimensional memory device including multibit ferroelectric memory cells and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers; and memory stack structures vertically extending through the alternating stack, wherein: each of the memory stack structures comprises a vertical semiconductor channel and a vertical stack of ferroelectric memory elements surrounding the vertical semiconductor channel and located at levels of the electrically conductive layers; and each of the ferroelectric memory elements comprises a respective vertical stack of a first ferroelectric material portion and a second ferroelectric material portion that differs from the first ferroelectric material portion by at least one of a material composition and a lateral thickness.

According to another aspect of the present disclosure, a method of forming a semiconductor structure is provided, which comprises: forming multiple repetitions of a unit layer stack over a substrate, the unit layer stack comprising an insulating layer, a first-type sacrificial material layer comprising a first sacrificial material, and a second-type sacrificial material layer comprising a second sacrificial material; forming memory openings through the multiple repetitions of the unit layer stack; forming first memory recesses by isotropically recessing instances of the first-type sacrificial material layers around the memory openings; forming first ferroelectric material portions in the first memory recesses; forming second memory recesses by isotropically recessing instances of the second-type sacrificial material layers around the memory openings; forming second ferroelectric material portions in the second memory recesses, wherein ferroelectric memory elements including a respective one of the first ferroelectric material portions and a respective one of the second ferroelectric material portions are formed; and forming vertical semiconductor channels in the memory openings on a respective vertical stack of the ferroelectric memory elements.

BRIEF DESCRIPTION OF THE DRAWINGS

FIGS. 5A-5F are sequential schematic vertical cross-sectional views of a memory opening within the exemplary structure during formation of a memory opening fill structure in a first configuration according to a first embodiment of the present disclosure.

FIGS. 6A-6F are sequential schematic vertical cross-sectional views of a memory opening within the exemplary structure during formation of a memory opening fill structure in a second configuration according to a second embodiment of the present disclosure.

FIGS. 7A-7F are sequential schematic vertical cross-sectional views of a memory opening within the exemplary structure during formation of a memory opening fill structure in a third configuration according to a third embodiment of the present disclosure.

FIGS. 9A-9F are sequential schematic vertical cross-sectional views of a memory opening within the exemplary structure during formation of a memory opening fill structure in a fifth configuration according to a fifth embodiment of the present disclosure.

FIGS. 14A-14E are vertical cross-sectional views of various configurations of a memory opening fill structure according to first through fifth embodiments of the present disclosure, respectively.

DETAILED DESCRIPTION

Figure 1:
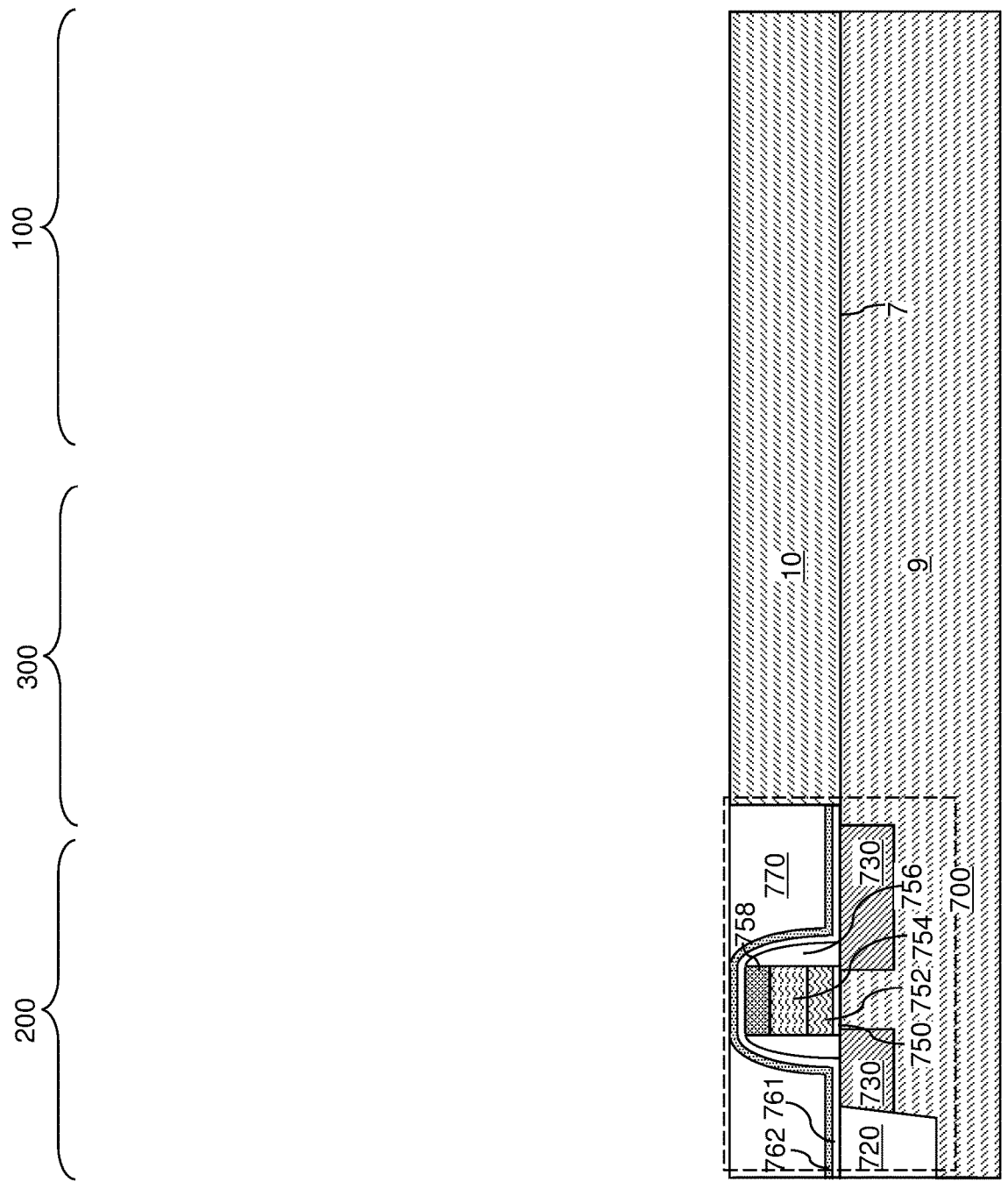
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device including multibit ferroelectric memory cells and methods of manufacturing the same, the various aspects of which are described below. The embodiments of the disclosure can be employed to form various semiconductor structures including an array of ferroelectric memory cells.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
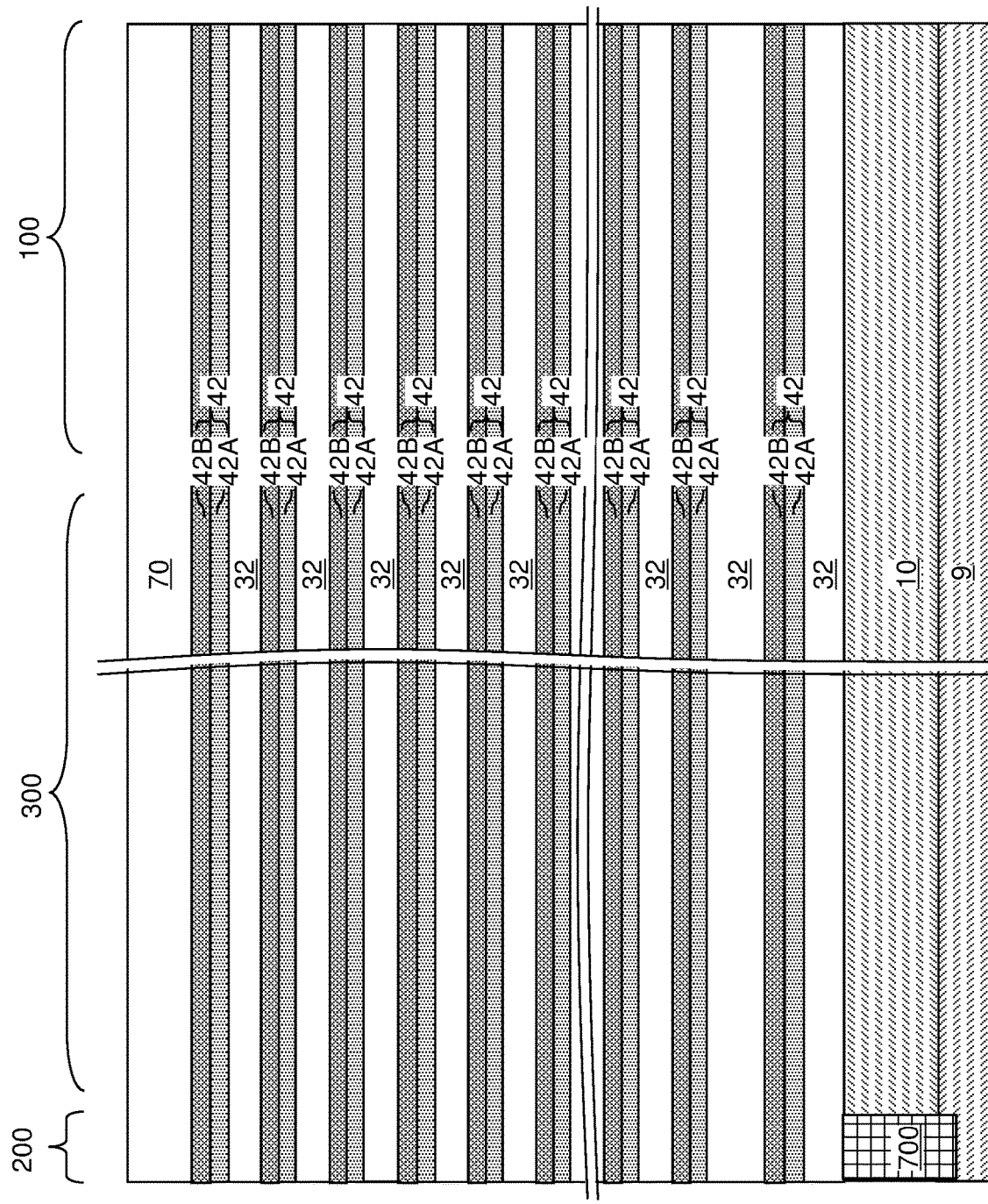
FIG. 2 is a schematic vertical cross-sectional view of the exemplary structure after formation of multiple repetitions of a unit layer stack that includes an insulating layer, a first-type sacrificial material layer comprising a first sacrificial material, and a second-type sacrificial material layer according to an embodiment of the present disclosure.

Referring to FIG. 2, multiple repetitions of a unit layer stack (32, 42A, 42B) can be formed over the substrate (9, 10). In one embodiment, the unit layer stack (32, 42A, 42B) can include an insulating layer 32, a first-type sacrificial material layer 42A comprising a first sacrificial material, and a second-type sacrificial material layer 42B comprising a second sacrificial material. The first sacrificial material and the second sacrificial material comprise materials that can be removed selective to the material of the insulating layers 32. The first sacrificial material and the second sacrificial material layer differ in material composition such that the first sacrificial material and the second sacrificial material have different etch rates in an isotropic etch process that etches the materials of the first sacrificial material layer and the seconds sacrificial material layer selective to the material of the insulating layers 32.

In an illustrative example, the insulating layers 32 can include a silicon oxide material such as undoped silicate glass or a doped silicate glass, and the first-type sacrificial material layers 42A and the second-type sacrificial material layers 42B can include silicon nitride materials or silicon oxynitride materials having different material compositions. In one embodiment, the first-type sacrificial material layers 42A and the second-type sacrificial material layers 42B silicon nitride materials having different densities.

For example, the first-type sacrificial material layers 42A may include a more porous silicon nitride material having a density in a range from 2.34 g/cm$^3$ to 2.58 g/cm$^3$. Such a porous silicon nitride material may be deposited by a plasma enhanced chemical vapor deposition process in which a higher plasma power is employed, can have a refractive index in a range from 1.74 to 1.90, and can have an etch rate in a range from 5 nm/min to 90 nm/min in a 100:1 dilute hydrofluoric acid at room temperature. The second-type sacrificial material layers 42B may include a non-porous silicon nitride material or a less porous silicon nitride material having a greater density than the more porous silicon nitride material of the first-type sacrificial silicon material layers 42A. In one embodiment, the second-type sacrificial material layer 42B can have a density in a range from 2.45 g/cm$^3$ to 2.65 g/cm$^3$, such as from 2.59 g/cm$^3$ to 2.65 g/cm$^3$. Such second silicon nitride material may be deposited by a plasma enhanced chemical vapor deposition process in which a lower plasma power is employed, can have a refractive index in a range from 1.82 to 1.94, and can have an etch rate in a range from 2.5 nm/min to 25 nm/min, such as from 2.5 nm/min to 5 nm/min, in a 100:1 dilute hydrofluoric acid at room temperature. Each contiguous combination of a first-type sacrificial material layer 42A and a second-type sacrificial material layer 42B constitutes a composite sacrificial material layer 42.

The insulating layers 32 and the composite sacrificial material layers 42 vertically alternate to form an alternating stack (32, 42) of the insulating layers 32 and the composite sacrificial material layers 42. The thicknesses of each of the insulating layers 32 and the composite sacrificial material layers 42 can be in a range from 20 nm to 60 nm, although lesser and greater thicknesses can be employed for each insulating layer 32 and for each composite sacrificial material layer 42. The thickness of each first-type sacrificial material layer 42A may be in a range from 10 nm to 30 nm, and the thickness of each second-type sacrificial material layer 42B may be in a range from 10 nm to 30 nm, although lesser and greater thicknesses may also be employed.

The number of repetitions of the pairs of an insulating layer 32 and a composite sacrificial material layer 42 can be in a range from 2 to 1,024, and typically from 8 to 256, although a greater number of repetitions can also be employed. In one embodiment, each composite sacrificial material layer 42 in the alternating stack (32, 42) can have a uniform thickness that is substantially invariant within each respective composite sacrificial material layer 42.

Optionally, an insulating cap layer 70 can be formed over the alternating stack (32, 42). The insulating cap layer 70 includes a dielectric material that is different from the material of the composite sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
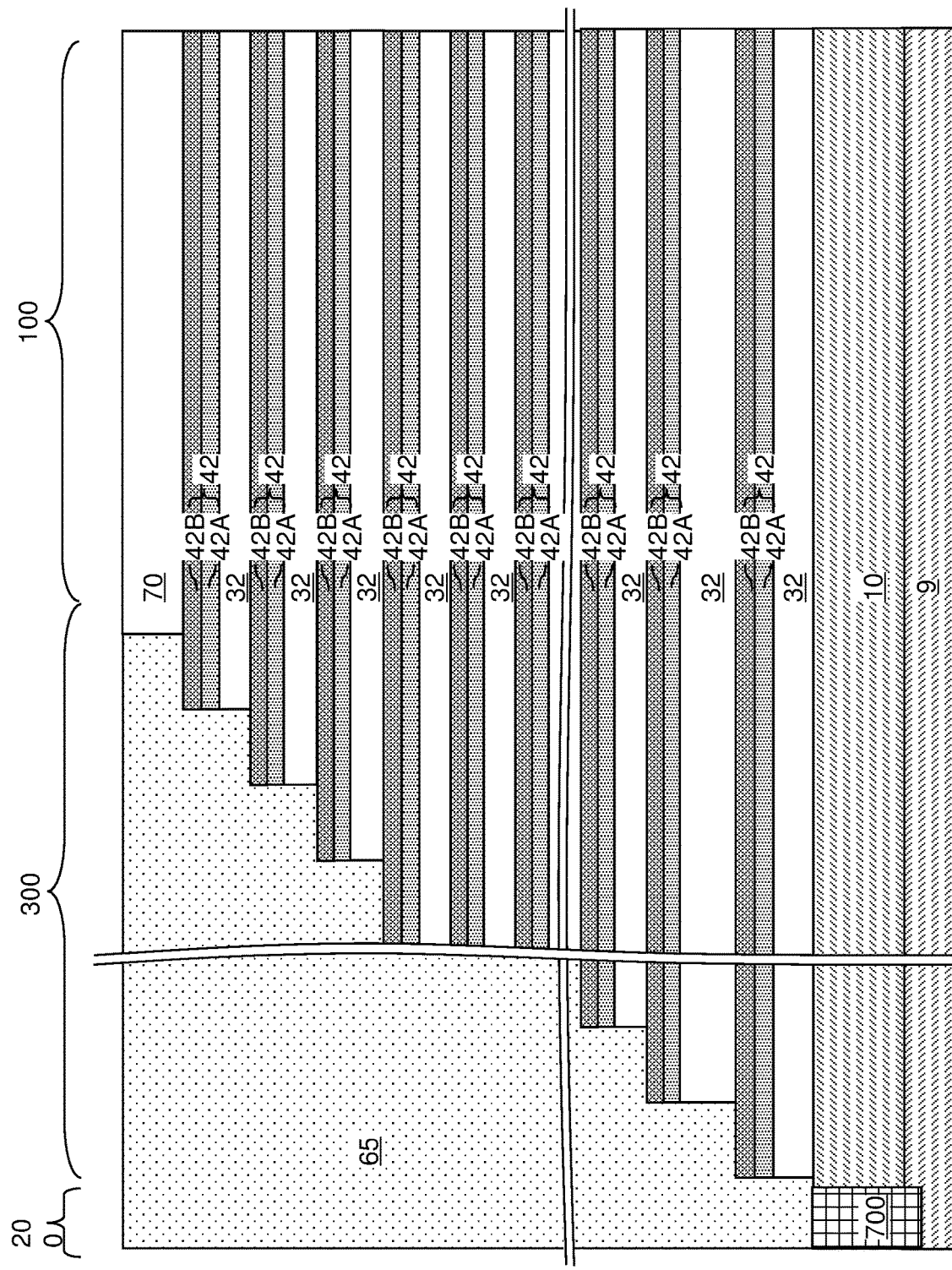
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each composite sacrificial material layer 42 other than a topmost composite sacrificial material layer 42 within the alternating stack (32, 42) laterally extends farther than any overlying composite sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42). While the present disclosure is described employing an embodiment in which a second-type sacrificial material layer 42B overlies a first-type sacrificial material layer 42A within each unit layer stack (32, 42A, 42B), embodiments are expressly contemplated in which a first-type sacrificial material layer 42A overlies a second-type sacrificial material layer 42B within each unit layer stack (32, 42A, 42B).

Each vertical step of the stepped surfaces can have the height of one or more pairs of an insulating layer 32 and a composite sacrificial material layer. In one embodiment, each vertical step can have the height of a single pair of an insulating layer 32 and a composite sacrificial material layer 42. In another embodiment, multiple "columns" of staircases can be formed along a first horizontal direction hd1 such that each vertical step has the height of a plurality of pairs of an insulating layer 32 and a composite sacrificial material layer 42, and the number of columns can be at least the number of the plurality of pairs. Each column of staircase can be vertically offset among one another such that each of the composite sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered composite sacrificial material layers 42 (as counted from the bottom) and another column of staircases provide physically exposed top surfaces for even-numbered composite sacrificial material layers (as counted from the bottom). Configurations employing three, four, or more columns of staircases with a respective set of vertical offsets among the physically exposed surfaces of the composite sacrificial material layers 42 may also be employed. Each composite sacrificial material layer 42 has a greater lateral extent, at least along one direction, than any overlying composite sacrificial material layers 42 such that each physically exposed surface of any composite sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the composite sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
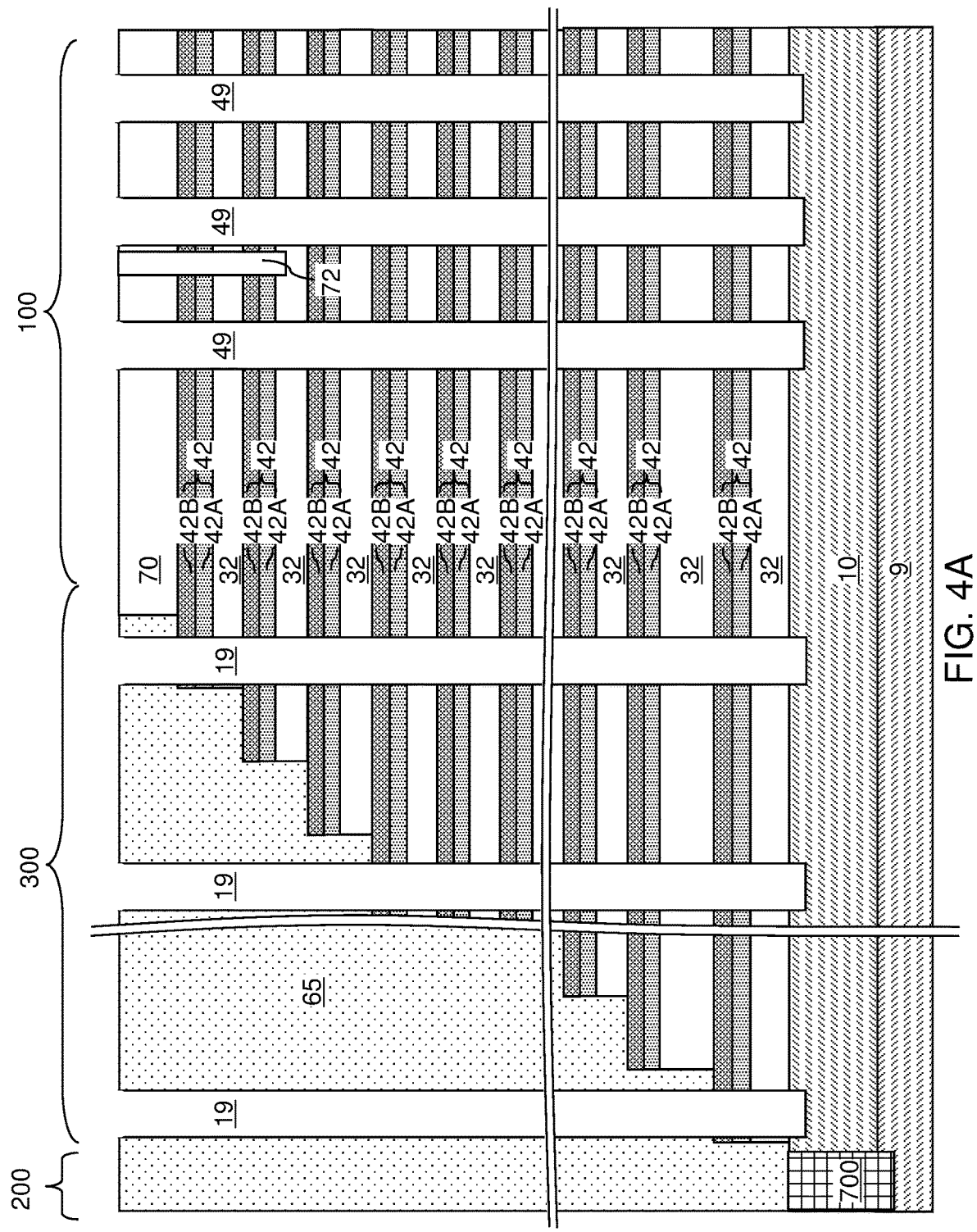
FIG. 4A is a schematic vertical cross-sectional view of the exemplary structure after formation of memory openings and support openings according to an embodiment of the present disclosure.
Figure 4B:
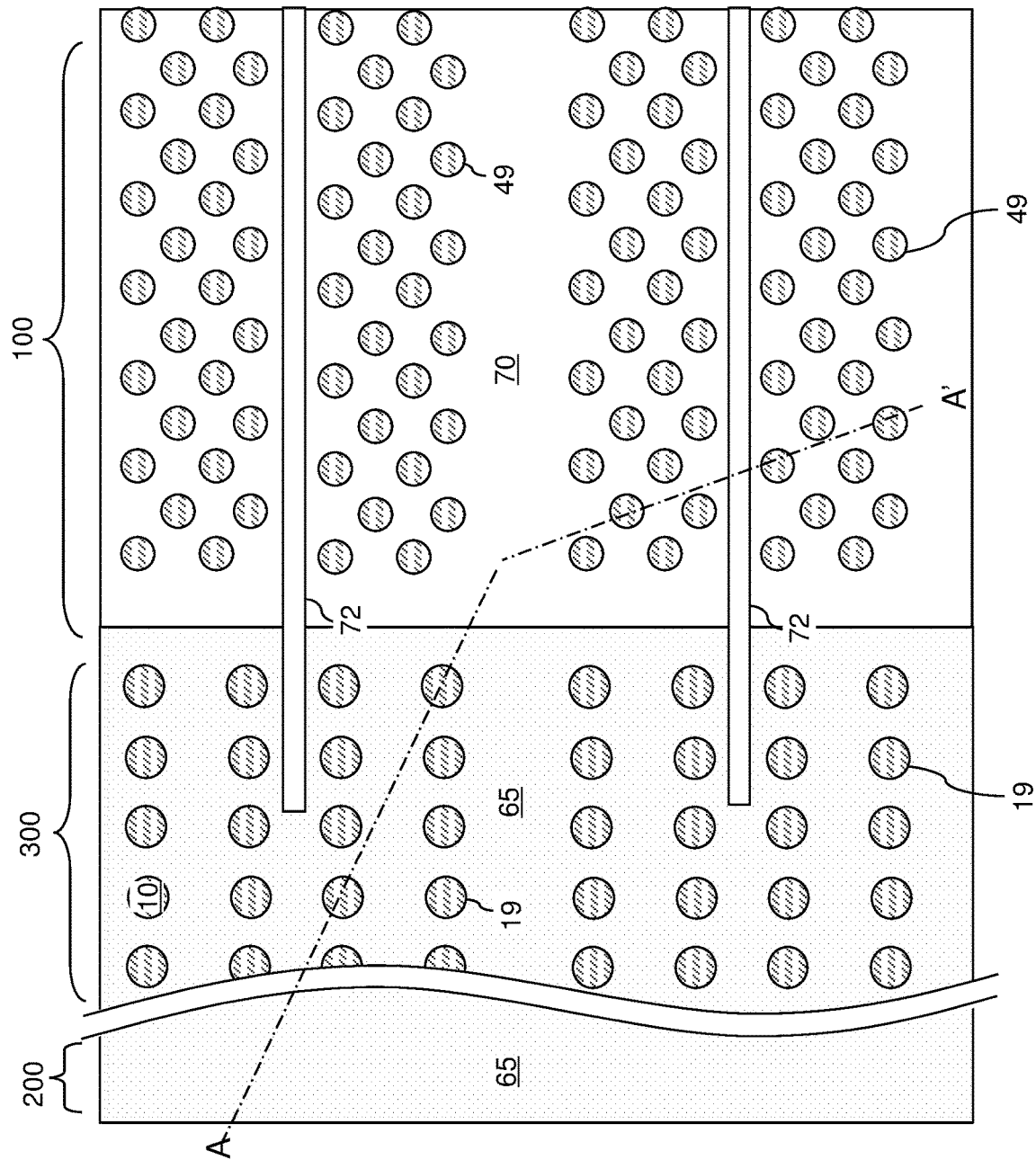
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5F are sequential schematic vertical cross-sectional views of a memory opening within the exemplary structure during formation of a memory opening fill structure in a first configuration according to the first embodiment of the present disclosure.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the composite sacrificial material layers 42 can be laterally recessed partially to form lateral recesses (not shown), for example, by an isotropic etch.

Referring to FIG. 5B, an isotropic etch process can be performed to laterally recess the first-type sacrificial material layers 42A and the second-type sacrificial material layers 42B than the insulating layers 32, and to also laterally recess the first-type sacrificial material layers 42A at a higher etch rate (i.e., at a higher recess rate) than the second-type sacrificial material layers 42B. First memory recesses 149A are formed in volumes from which the first-type sacrificial material layers 42A are laterally recessed (i.e., removed), and second memory recesses 149B are formed in volumes from which the second-type sacrificial material layers 42B are laterally recessed (i.e., removed). The first memory recesses 149A are wider (i.e., have a greater width in the horizontal direction) than the second memory recesses 149B. Each contiguous combination of a first memory recess 149A and a second memory recess 149B comprises a memory recess 149 having a toroidal configuration. The volume of each memory recess 149 can be defined by a recessed sidewalls of the first-type sacrificial material layer 42A and the second-type sacrificial material layer 42B, an annular bottom surface of the overlying insulating layer 32, an annular top surface of the underlying insulating layer 32, and an annular horizontal (e.g., bottom) surface of the second-type sacrificial material layer 42B that is physically exposed to the second memory recess 149B within the memory recess 149.

The isotropic etch process simultaneously forms the first memory recesses 149A and the second memory recesses 149B by etching the first sacrificial material and the second sacrificial material at different etch rates. The ratio of the etch rate of the first sacrificial material to the etch rate of the second sacrificial material may be in a range from 2 to 40, such as from 4 to 10, although lesser and greater ratios may also be employed. The ratio of the etch rate of the second sacrificial material to the etch rate of the insulating layers 32 may be in a range from 2 to 1,000, such as from 2 to 8, although lesser and greater ratios may also be employed.

For example, the first-type sacrificial material layers 42A may be a silicon nitride material having a higher etch rate, the second-type sacrificial material layers 42B can include a silicon nitride material having a lower etch rate, and the insulating layers 32 can include silicon oxide. In this case, a wet etch process, such as a 100:1 dilute HF etch process, can be performed to etch the first-type sacrificial material layers 42A and the second-type sacrificial material layers 42B at a higher etch rate than the insulating layers 32. Generally, the first memory recesses 149A and the second memory recesses 149B can be formed by isotropically recessing each instance of the first-type sacrificial material layers 42A and each instance of the second-type sacrificial material layers 42B around the memory openings 49. The lateral recess distance of the first memory recesses 149A can be in a range from 10 nm to 80 nm, such as from 20 nm to 40 nm, and the lateral recess distance of the second memory recesses 149B can be in a range from 5 nm to 50 nm, such as from 10 nm to 20 nm, although lesser and greater lateral recess distances may also be employed. The lateral recess distance of a first memory recess 149A can be measured between a recessed sidewall of a first-type sacrificial material layer 42A and a sidewall of an insulating layer 32 that contacts the first-type sacrificial material layer 42A. The lateral recess distance of a second memory recess 149B can be measured between a recessed sidewall of a second-type sacrificial material layer 42B and a sidewall of an insulating layer 32 that contacts the second-type sacrificial material layer 42B.

Figure 5D:
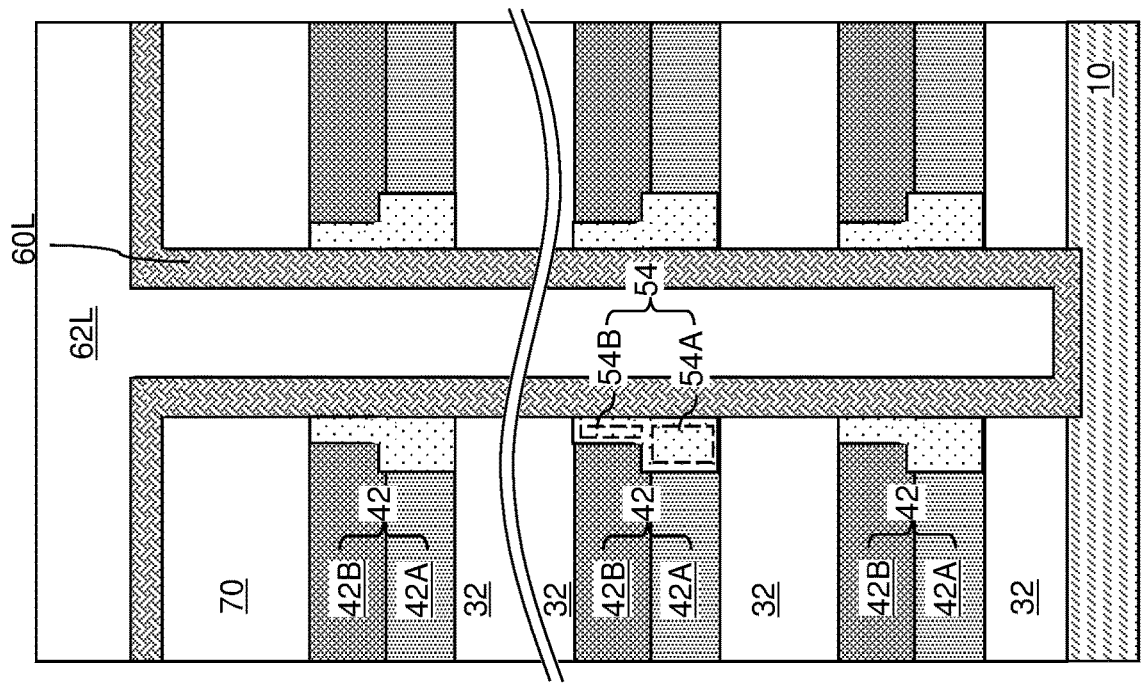
Figure 5C:
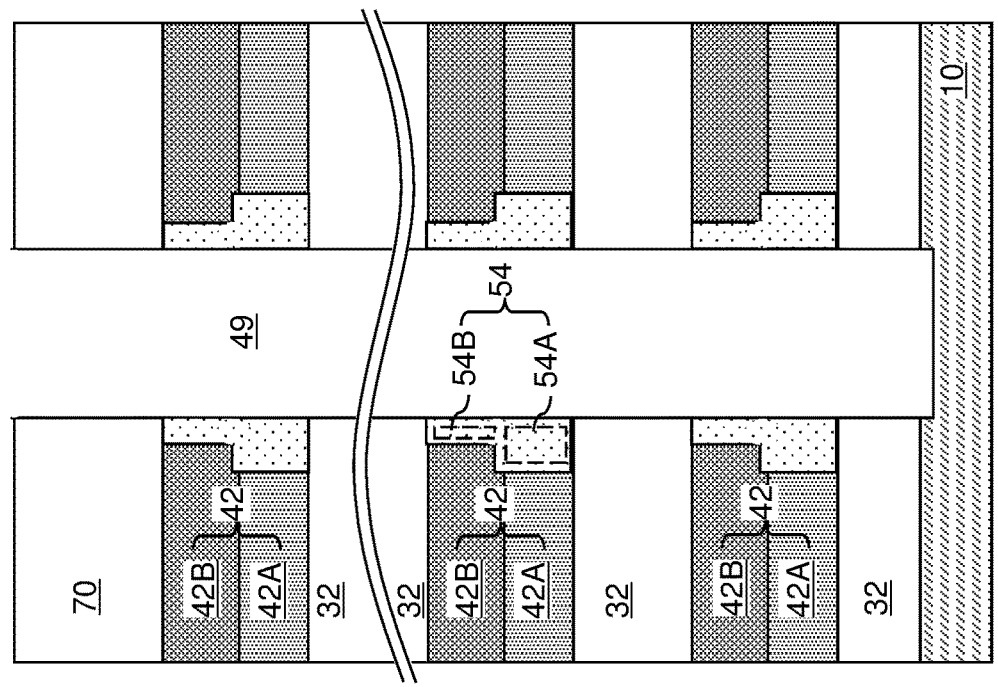

Referring to FIG. 5C, a ferroelectric material can be deposited in the memory recesses 149 by a conformal deposition process, which may comprise a chemical vapor deposition process or an atomic layer deposition process. A ferroelectric material layer can be deposited within each of the first memory recesses 149A and the second memory recesses 149B and on sidewalls of each instance of the insulating layer 32 by the conformal deposition process. The ferroelectric material has two stable directions for electrical polarization in a crystalline form. For example, the ferroelectric material may include at least one material selected from hafnium oxide, zirconium oxide, hafnium-zirconium oxide, barium titanate (such as $BaTiO_3$; BT), colemanite (such as $Ca_2B_6O_{11}.5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as Pb $(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6.4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric material can include orthorhombic phase hafnium oxide, and preferably including at least one dopant selected from Al, Zr, Y, Gd, La, Sr, and/or Si. The ferroelectric material may fill the entire volume of each memory recess 149.

An anisotropic etch process can be performed to remove portions of the ferroelectric material located outside the volumes of the memory recesses 149. Portions of the ferroelectric material layer can be removed from inside the memory openings 49 and from above the multiple repetitions of the unit layer stack (32, 42A, 42B). Specifically, the ferroelectric material can be removed from above the insulating cap layer 70, and from within the volumes of the memory openings 49 that are located within the toroidal volumes of the memory recesses 149. Each remaining portion of the ferroelectric material located within a respective memory recess 149 comprises a discrete ferroelectric memory element 54. Each ferroelectric memory element 54 can include a first ferroelectric material portion 54A located in a first memory recess 149A and a second ferroelectric material portion 54B located in a second memory recess 149B. Thus, each ferroelectric memory element 54 includes a respective one of the first ferroelectric material portions 54A and a respective one of the second ferroelectric material portions 54B. The first ferroelectric material portion 54A is narrower than a respective second ferroelectric material portion 54B of the same ferroelectric memory element 54.

Referring to FIG. 5D, a semiconductor channel layer 60L can be formed by conformally depositing a semiconductor material. The semiconductor channel layer 60L can include at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The semiconductor channel layer 60L can have a doping of a first conductivity type, which may be p-type or n-type. The thickness of the semiconductor channel layer 60L can be in a range from 2 nm to 10 nm, although lesser and greater thicknesses can also be employed.

Remaining volumes of the memory openings 49 can be filled with a dielectric material to form a dielectric core layer 62L. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5E, the dielectric material of the dielectric core layer 62L can be vertically recessed by a recess etch process, which may employ an isotropic etch process or an anisotropic etch process. The recess etch process may be selective to the semiconductor material of the semiconductor channel layer 60L. Top surfaces of remaining portions of the dielectric core layer 62L can be vertically recessed below the horizontal plane including the top surface of the insulating cap layer 70. Each remaining portion of the dielectric core layer 62L comprises a dielectric core 62.

Referring to FIG. 5F, a doped semiconductor material having a doping of a second conductivity type can be deposited in recess regions overlying the dielectric cores 62. The second conductivity type can be the opposite of the first conductivity type. Portions of the deposited doped semiconductor material and the semiconductor channel layer 60L overlying the horizontal plane including the top surface of the insulating cap layer 70 can be removed by a planarization process such as a chemical mechanical planarization process. Remaining portions of the doped semiconductor material having a doping of the second conductivity type comprise drain regions 63. Each remaining portion of the semiconductor channel layer 60L comprises a vertical semiconductor channel 60.

Each contiguous combination of a vertical semiconductor channel 60 and a vertical stack of discrete ferroelectric memory elements 54 comprises a memory stack structure (54, 60). Each contiguous combination of material portions that are deposited in a memory opening 49 and adjoining memory recesses 149 constitute a memory opening fill structure 58. In one embodiment, each memory opening fill structure 58 can include a vertical semiconductor channel 60, a vertical stack of discrete ferroelectric memory elements 54, a dielectric core 62, and a drain region 63. Each contiguous material portion that is formed within, or around, a support opening 19 comprises a support pillar structure.

Each ferroelectric memory element 54 comprises a first ferroelectric material portion 54A and a second ferroelectric material portion MB. The first ferroelectric material portion 54A may be located above or below the second ferroelectric material portion 54B in a direction perpendicular to the top surface 7 of the substrate 9. In one embodiment, the first ferroelectric material portion 54A and the second ferroelectric material portion 54B have a same material composition and different lateral thicknesses. In one embodiment, each vertical semiconductor channel 60 has a straight outer sidewall that vertically extends through each layer within the alternating stack (32, 42). In one embodiment, each of the ferroelectric memory elements 54 contacts a bottom surface of a respective overlying one of the insulating layers 32 and a top surface of a respective overlying one of the insulating layers 32. In one embodiment, each of the ferroelectric memory elements 54 has a toroidal configuration and comprises a straight inner sidewall, an annular top surface, and an annular bottom surface.

In one embodiment, each of the ferroelectric memory elements 54 comprises a stepped outer sidewall including a first cylindrical surface that is laterally offset from the vertical semiconductor channel 60 by a first lateral distance LD1, a second cylindrical surface that is laterally offset from the vertical semiconductor channel 60 by a second lateral distance LD2, and an annular horizontal surface adjoined to an edge of the first cylindrical surface and adjoined to an edge of the second cylindrical surface.

In one embodiment, each ferroelectric memory element 54 within the vertical stack of ferroelectric memory elements 54 has a top surface that is coplanar with an interface between one of the composite sacrificial material layers 42 and an overlying one of the insulating layers 32, and has a bottom surface that is coplanar with an interface between the one of the composite sacrificial material layers 42 and an underlying one of the insulating layers 32. In one embodiment, the vertical semiconductor channel 60 of each of the memory stack structures (54, 60) laterally surrounds a respective dielectric core 62 and has an end portion contacting a drain region 63.

FIGS. 6A-6F are sequential schematic vertical cross-sectional views of a memory opening within the exemplary structure during formation of a memory opening fill structure in a second configuration according to the second embodiment of the present disclosure.

Figure 6A:
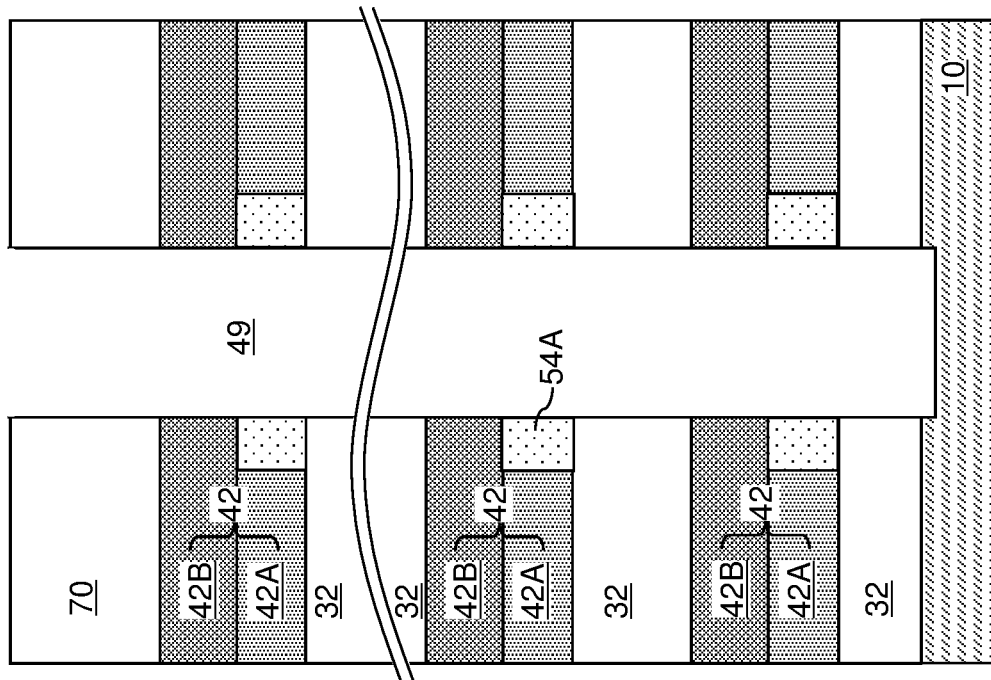

Referring to FIG. 6A, the second configuration of a memory opening 49 can be derived from the first configuration of the memory opening 49 illustrated in FIG. 5A by performing an isotropic etch process. In this embodiment, the etch chemistry of the isotropic etch process can be selected such that the etch rate of the first sacrificial material of the first-type sacrificial material layers 42A is greater than the etch rate of the second sacrificial material of the second-type sacrificial material layer 42B and is greater than the etch rate of the insulating layers 32. In one embodiment, the etch chemistry of the isotropic etch process can be selected such that the etch rate of the second sacrificial material of the second-type sacrificial material layer 42B and the etch rate of the material of the insulating layers 32 are about the same. For example, a wet etch process can be performed to isotropically recess the first sacrificial material of the first-type sacrificial material layers 42A relative to the insulating layers 32 and the second-type sacrificial material layers 42B. First memory recesses 149A are formed in volumes formed by lateral recessing of the sidewalls of the first-type sacrificial material layers 42A relative to the sidewalls of the second-type sacrificial material layers 42B and the insulating layers 32.

Figure 6B:
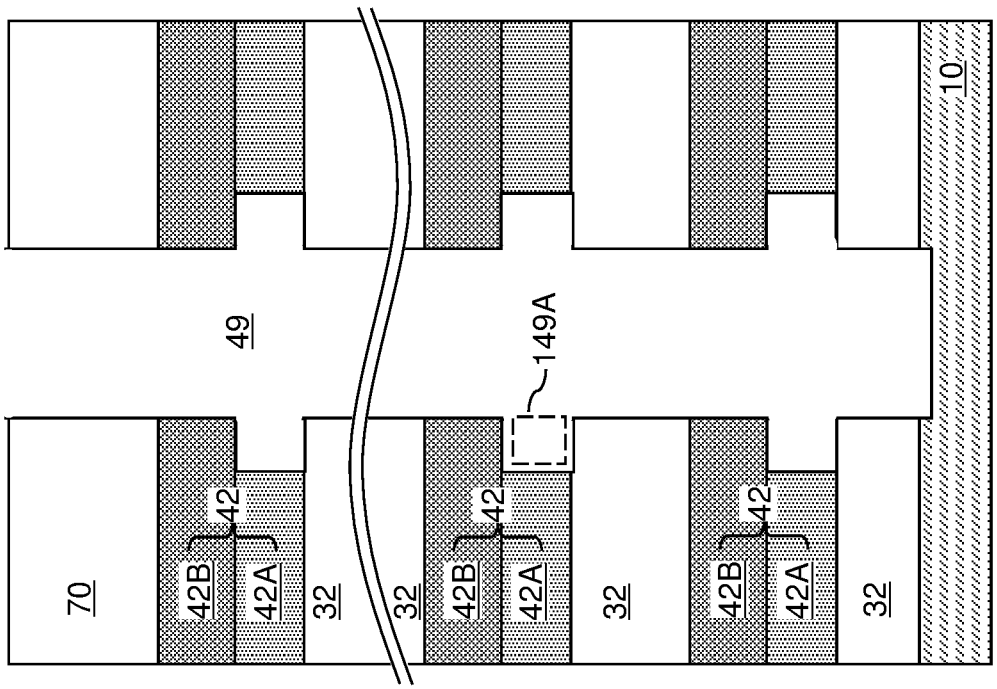

Referring to FIG. 6B, a first ferroelectric material can be deposited in the first memory recesses 149A by a conformal deposition process such as a chemical vapor deposition process. The first ferroelectric material may be any material that may be employed for the ferroelectric memory elements 54 as described above. Conformal deposition of the first ferroelectric material forms a first ferroelectric material layer.

An anisotropic etch process can be performed to remove portions of the first ferroelectric material layer located outside the first memory recesses 149A. Each remaining portion of the first ferroelectric material that remains in a first memory recess 149A comprises a first ferroelectric material portion 54A.

Referring to FIG. 6C, an isotropic etch process can be performed to laterally recess the second-type sacrificial material layers 42B selective to the materials of the insulating layers 32 and the first ferroelectric material portions 54A. For example, a wet etch process can be performed to isotropically recess the second sacrificial material of the second-type sacrificial material layers 42B. Second memory recesses 149B are formed in volumes formed by lateral recessing of the sidewalls of the second-type sacrificial material layers 42B relative to the insulating layers 32 and the first ferroelectric material portions 54A. Generally, the second memory recesses 149B can be formed after forming the first ferroelectric material portions 54A in the first memory recesses 149A by performing an isotropic etch process that etches the second sacrificial material selective to the first ferroelectric material portions 54A.

Referring to FIG. 6D, a second ferroelectric material can be deposited in the second memory recesses 149B by a conformal deposition process such as a chemical vapor deposition process. The second ferroelectric material may be any material that may be employed for the ferroelectric memory elements 54 as described above, but which is different from the ferroelectric material employed for the first ferroelectric material portions 54A. Conformal deposition of the second ferroelectric material forms a second ferroelectric material layer.

An anisotropic etch process can be performed to remove portions of the second ferroelectric material layer located outside the second memory recesses 149B. Each remaining portion of the second ferroelectric material that remains in a second memory recess 149B comprises a second ferroelectric material portion 54B. In one embodiment, the second ferroelectric material portions 54B may comprise a different ferroelectric material than the first ferroelectric material portions 54A. For example, the second ferroelectric material portions 54B may comprise aluminum doped hafnium oxide and the first ferroelectric material portions 54A may comprise silicon doped hafnium oxide, or vice-versa. If both the first and the second ferroelectric material portions comprise hafnium oxide, then a thin insulating barrier layer (e.g., self-assembly monolayer, inorganic dielectric or a polymer dielectric) may be formed between the first and the second ferroelectric material portions to prevent or reduce the different dopants (e.g., Si and Al) from interdiffusing between the first and the second ferroelectric material portions. In one embodiment, inner sidewalls of the first ferroelectric material portions 54A, inner sidewalls of the second ferroelectric material portions 54B, and sidewalls of the insulating layers 32 around each memory opening 49 can be vertically coincident, i.e., may be located within a same cylindrical plane that extends vertically. Each contiguous combination of a first ferroelectric material portion 54A and a second ferroelectric material portion 54B comprises a ferroelectric memory element 54.

Figure 6F:
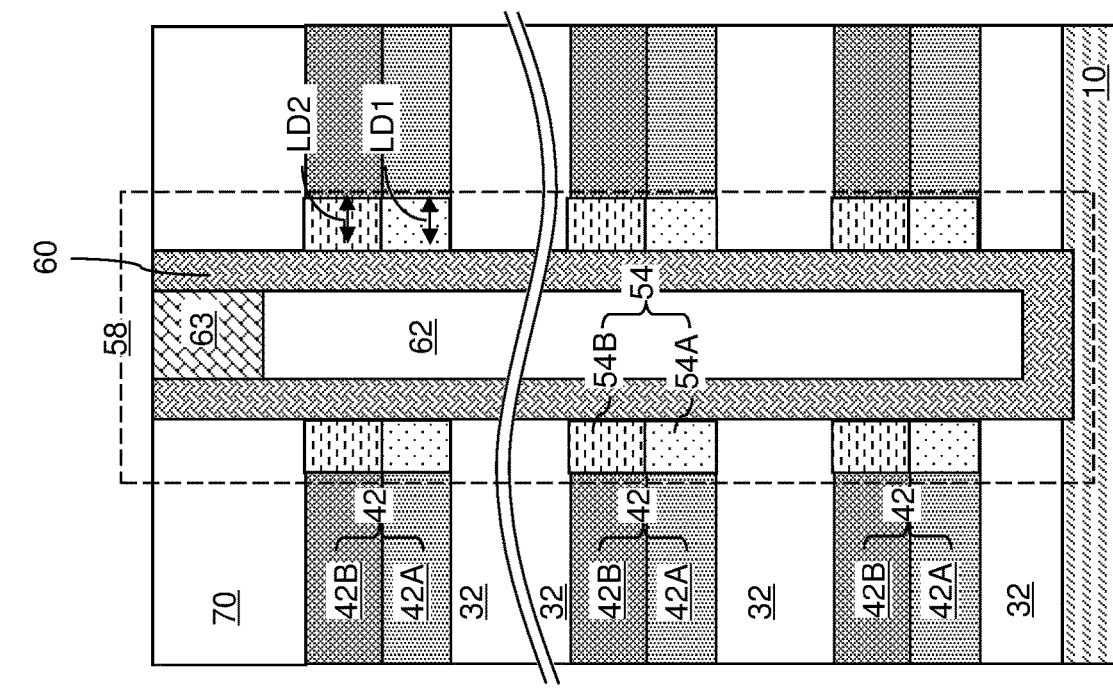
Figure 6E:
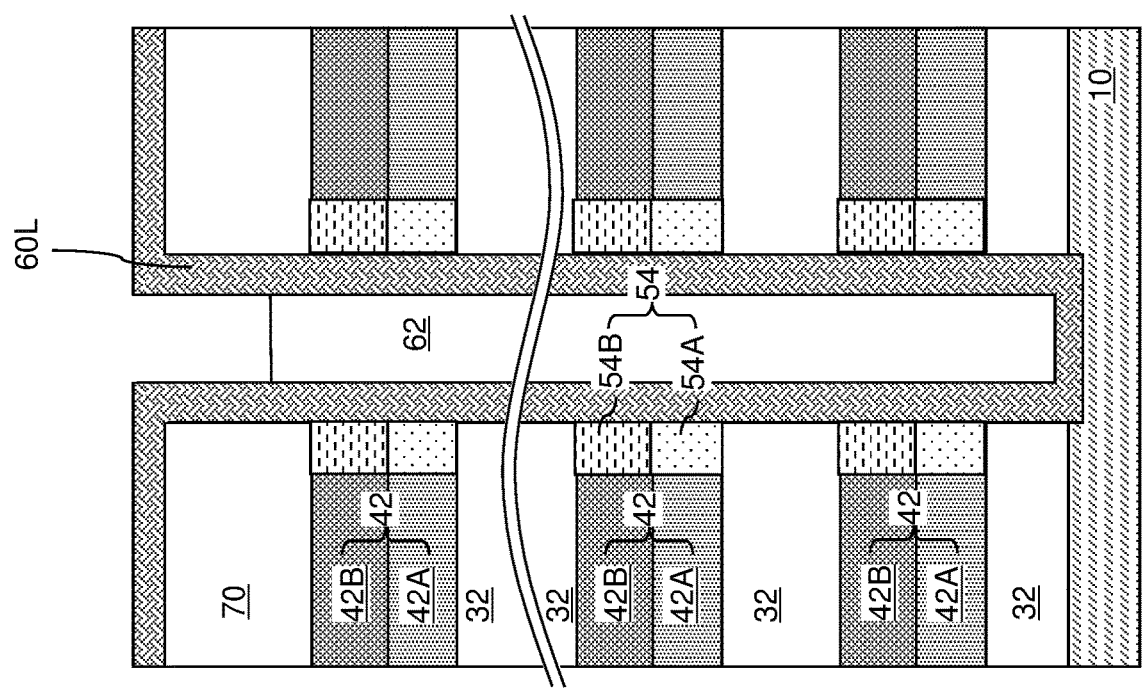

Referring to FIG. 6E, the processing steps of FIG. 5E can be performed to form a semiconductor channel layer 60L and dielectric cores 62.

Referring to FIG. 6F, the processing steps of FIG. 5F can be performed to form a memory stack structure (54, 60) in each memory opening 49. Each contiguous combination of a vertical semiconductor channel 60 and a vertical stack of ferroelectric memory elements 54 comprises a memory stack structure (54, 60). Each contiguous combination of material portions that are deposited in a memory opening 49 and adjoining memory recesses 149 constitute a memory opening fill structure 58. In one embodiment, each memory opening fill structure 58 can include a vertical semiconductor channel 60, a vertical stack of ferroelectric memory elements 54, a dielectric core 62, and a drain region 63. Each contiguous material portion that is formed within, or around, a support opening 19 comprises a support pillar structure.

Each ferroelectric memory element 54 comprises a first ferroelectric material portion 54A and a second ferroelectric material portion 54B. In one embodiment, the first ferroelectric material portion 54A and the second ferroelectric material portion 54B have different material compositions. In one embodiment, each vertical semiconductor channel 60 has a straight outer sidewall that vertically extends through each layer within the alternating stack (32, 42). In one embodiment, each of the ferroelectric memory elements 54 contacts a bottom surface of a respective overlying one of the insulating layers 32 and a top surface of a respective overlying one of the insulating layers 32. In one embodiment, each of the ferroelectric memory elements 54 has a toroidal configuration and comprises a straight inner sidewall, an annular top surface, and an annular bottom surface.

In one embodiment, each of the ferroelectric memory elements 54 may comprise a stepped outer sidewall including a first cylindrical surface that is laterally offset from the vertical semiconductor channel 60 by a first lateral distance LD1, a second cylindrical surface that is laterally offset from the vertical semiconductor channel 60 by a second lateral distance LD2, and an annular horizontal surface adjoined to an edge of the first cylindrical surface and adjoined to an edge of the second cylindrical surface. The lateral thicknesses (LD1, LD2) of the first ferroelectric material portions 54A and the second ferroelectric material portions 54B may be the same, or may be different.

In one embodiment, each ferroelectric memory element 54 within the vertical stack of ferroelectric memory elements 54 has a top surface that is coplanar with an interface between one of the composite sacrificial material layers 42 and an overlying one of the insulating layers 32, and has a bottom surface that is coplanar with an interface between the one of the composite sacrificial material layers 42 and an underlying one of the insulating layers 32. In one embodiment, the vertical semiconductor channel 60 of each of the memory stack structures (54, 60) laterally surrounds a respective dielectric core 62 and comprises an end portion contacting a drain region 63.

FIGS. 7A-7F are sequential schematic vertical cross-sectional views of a memory opening within the exemplary structure during formation of a memory opening fill structure in a third configuration according to a third embodiment of the present disclosure.

Figure 7B:
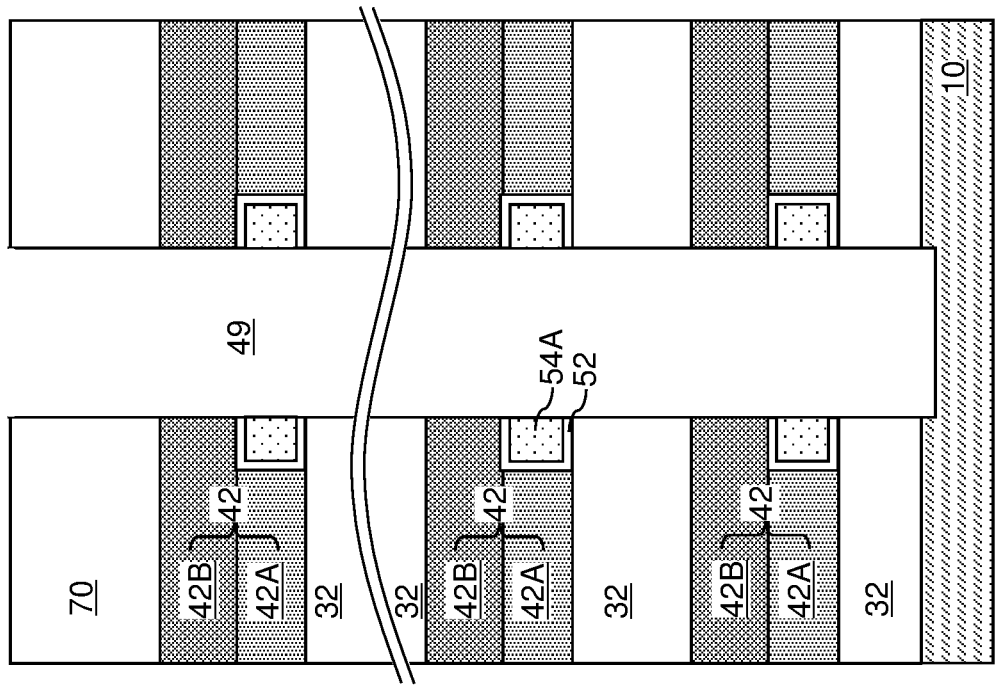
Figure 7A:
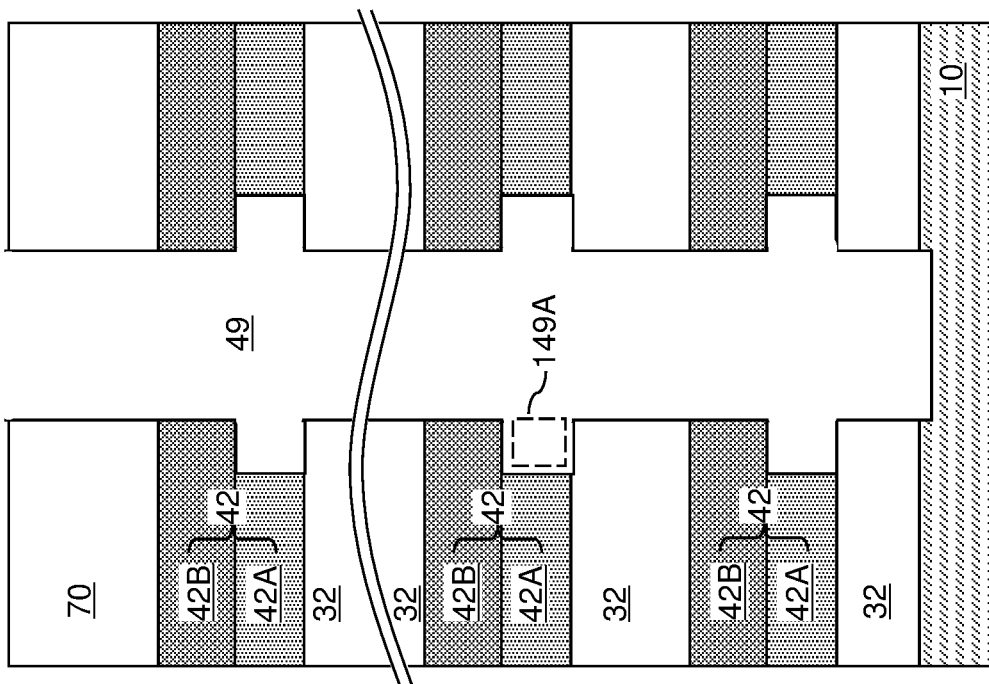

Referring to FIG. 7A, the third configuration of a memory opening 49 can be the same as the second configuration of the memory opening 49 illustrated in FIG. 6A. Generally, first memory recesses 149A are formed in volumes formed by lateral recessing of the sidewalls of the first-type sacrificial material layers 42A relative to the sidewalls of the second-type sacrificial material layers 42B and the insulating layers 32.

Referring to FIG. 7B, a dielectric liner layer including a non-ferroelectric dielectric material can be deposited on physically exposed surfaces of the memory opening 49 and the first memory recesses 149A of the exemplary structure by a conformal deposition process. In one embodiment, the dielectric liner layer includes a dielectric material such as silicon oxide and/or a dielectric metal oxide (e.g., aluminum oxide). The thickness of the dielectric liner layer can be in a range from 1 nm to 5 nm, although lesser and greater thicknesses may also be employed.

A first ferroelectric material can be deposited in unfilled volumes of the first memory recesses 149A by a conformal deposition process such as a chemical vapor deposition process. The first ferroelectric material may be any material that may be employed for the ferroelectric memory elements 54 (e.g., for the first ferroelectric material portions 54A) as described above. Conformal deposition of the first ferroelectric material forms a first ferroelectric material layer.

An anisotropic etch process can be performed to remove portions of the first ferroelectric material layer and the dielectric liner layer located outside the first memory recesses 149A. Each remaining portion of the first ferroelectric material that remains in a first memory recess 149A comprises a first ferroelectric material portion 54A. Each remaining portion of the dielectric liner layer located in a first memory recess 149A comprises a dielectric liner 52. Each dielectric liner 52 may have a clam-shaped vertical cross-sectional profile, and comprises a top annular portion, a bottom annular portion, and a cylindrical portion connecting an outer edge of the top annular portion to the bottom annular portion. Each dielectric liner 52 can contact, and laterally surround, a respective first ferroelectric material portion 54A.

Figure 7D:
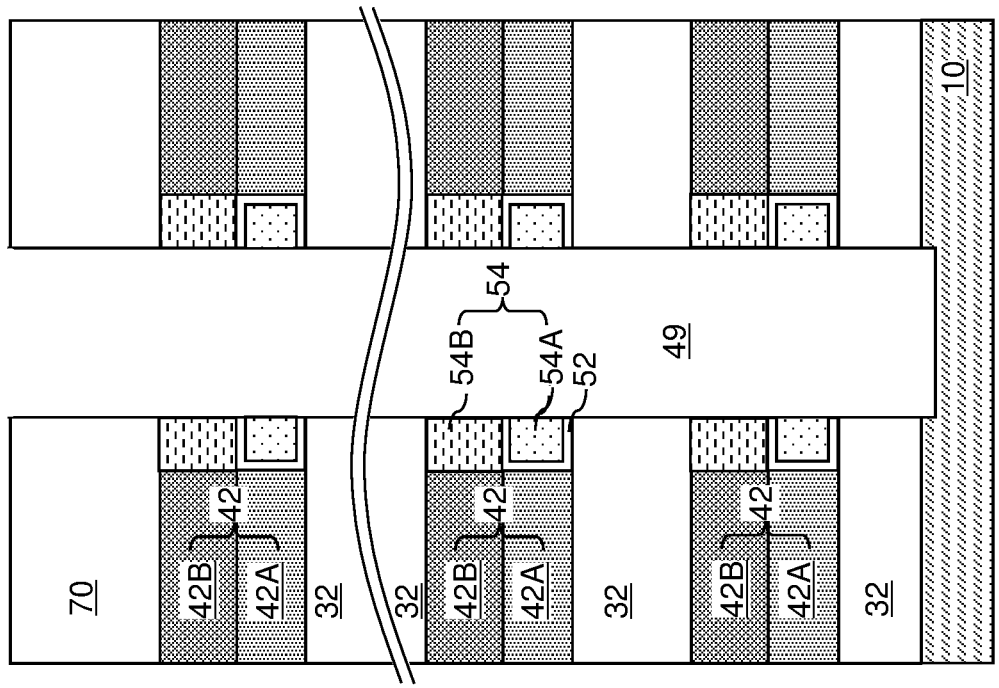
Figure 7C:
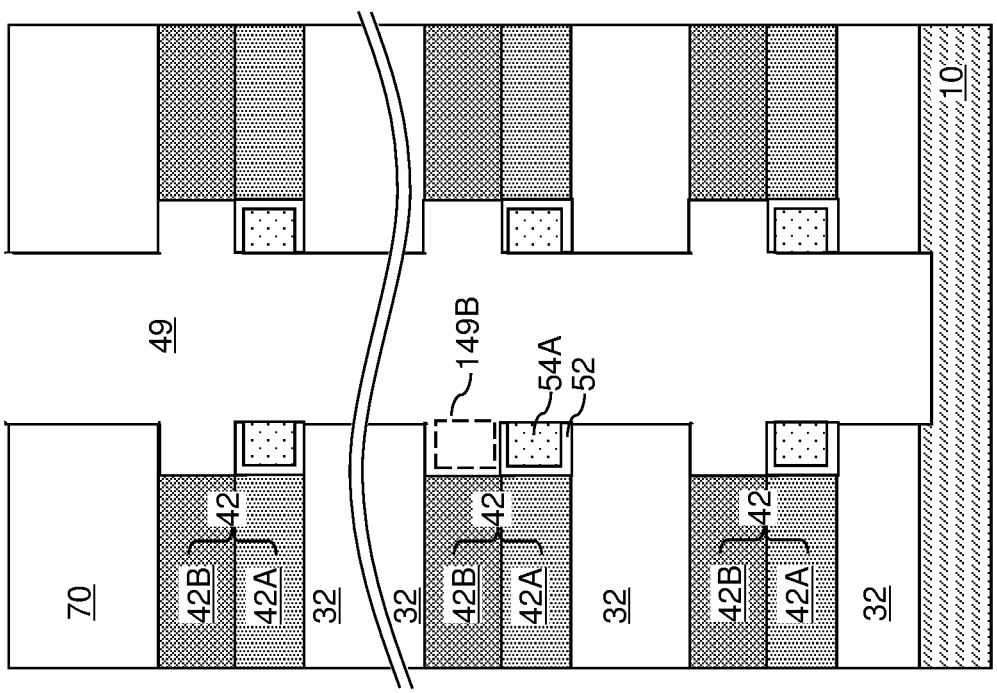

Referring to FIG. 7C, an isotropic etch process can be performed to laterally recess the second-type sacrificial material layers 42B selective to the materials of the insulating layers 32 and the first ferroelectric material portions 54A. For example, a wet etch process can be performed to isotropically recess the second sacrificial material of the second-type sacrificial material layers 42B. Second memory recesses 149B are formed in volumes formed by lateral recessing of the sidewalls of the second-type sacrificial material layers 42B relative to the insulating layers 32 and the first ferroelectric material portions 54A. Generally, the second memory recesses 149B can be formed after forming the first ferroelectric material portions 54A in the first memory recesses 149A by performing an isotropic etch process that etches the second sacrificial material selective to the first ferroelectric material portions 54A. Optionally, portions of the dielectric liners 52 can be removed during, or after, the isotropic etch process that forms the second memory recesses 149. The second memory recesses 149B may have the same or different width from the first memory recesses 149A.

Referring to FIG. 7D, a second ferroelectric material can be deposited in the second memory recesses 149B by a conformal deposition process such as a chemical vapor deposition process. The second ferroelectric material may be any material that may be employed for the ferroelectric memory elements 54 (e.g., for the second ferroelectric material portions 54B) as described above. Conformal deposition of the second ferroelectric material forms a second ferroelectric material layer.

An anisotropic etch process can be performed to remove portions of the second ferroelectric material layer located outside the second memory recesses 149B. Each remaining portion of the second ferroelectric material that remains in a second memory recess 149B comprises a second ferroelectric material portion 54B. In one embodiment, the second ferroelectric material portions 54B may comprise a different ferroelectric material than the first ferroelectric material portions 54A. In one embodiment, inner sidewalls of the first ferroelectric material portions 54A, inner sidewalls of the second ferroelectric material portions 54B, and sidewalls of the insulating layers 32 around each memory opening 49 can be vertically coincident, i.e., may be located within a same cylindrical plane that extends vertically. Each contiguous combination of a first ferroelectric material portion 54A and a second ferroelectric material portion 54B comprises a ferroelectric memory element 54. The dielectric liner 52 provides separation between the first and second ferroelectric material portions (e.g., to reduce or prevent interdiffusion between the two portions) and may also be used to cause the first ferroelectric material portion 54A to be narrower than the second ferroelectric material portion MB.

Referring to FIG. 7E, the processing steps of FIG. 5E can be performed to form a semiconductor channel layer 60L and dielectric cores 62.

Referring to FIG. 7F, the processing steps of FIG. 5F can be performed to form memory stack structures (54, 60) and drain regions 63.

FIGS. 8A-8F are sequential schematic vertical cross-sectional views of a memory opening within the exemplary structure during formation of a memory opening fill structure in a fourth configuration according to a fourth embodiment of the present disclosure. The fourth embodiment differs from the third embodiment in that the dielectric liner 52 is formed in the second first memory recesses 149B after formation of the first ferroelectric material portions 54A instead of in the first memory recesses 149A before formation of the first ferroelectric material portions 54A.

Figure 8A:
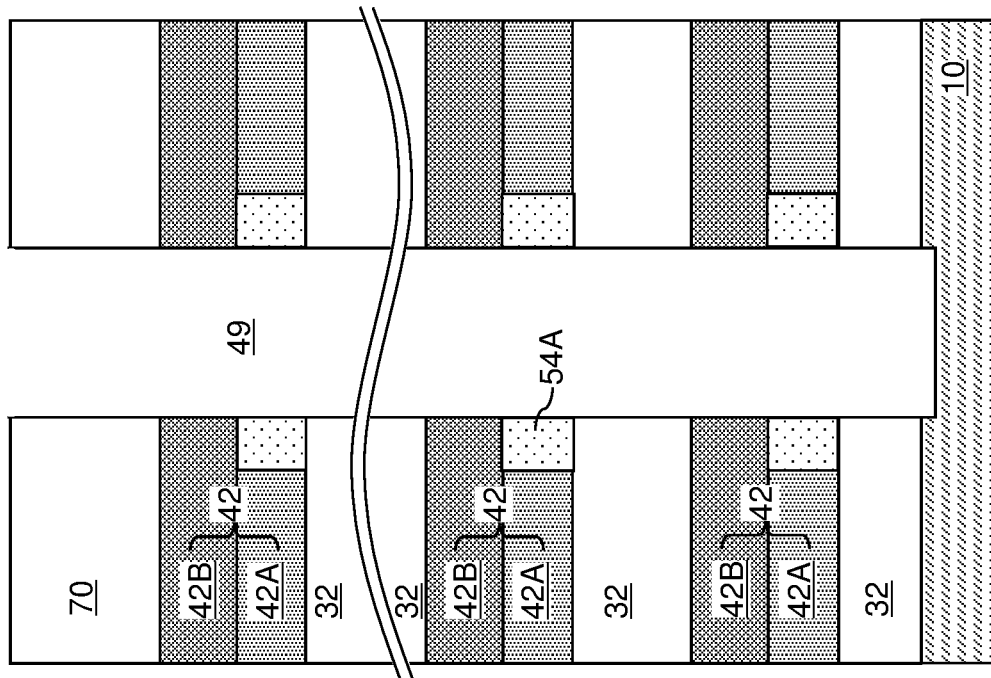
FIGS. 8A-8F are sequential schematic vertical cross-sectional views of a memory opening within the exemplary structure during formation of a memory opening fill structure in a fourth configuration according to a fourth embodiment of the present disclosure.

Referring to FIG. 8A, the fourth configuration of a memory opening 49 can be the same as the second configuration of the memory opening 49 illustrated in FIG. 6A. Generally, first memory recesses 149A are formed in volumes formed by lateral recessing of the sidewalls of the first-type sacrificial material layers 42A relative to the sidewalls of the second-type sacrificial material layers 42B and the insulating layers 32.

Figure 8B:
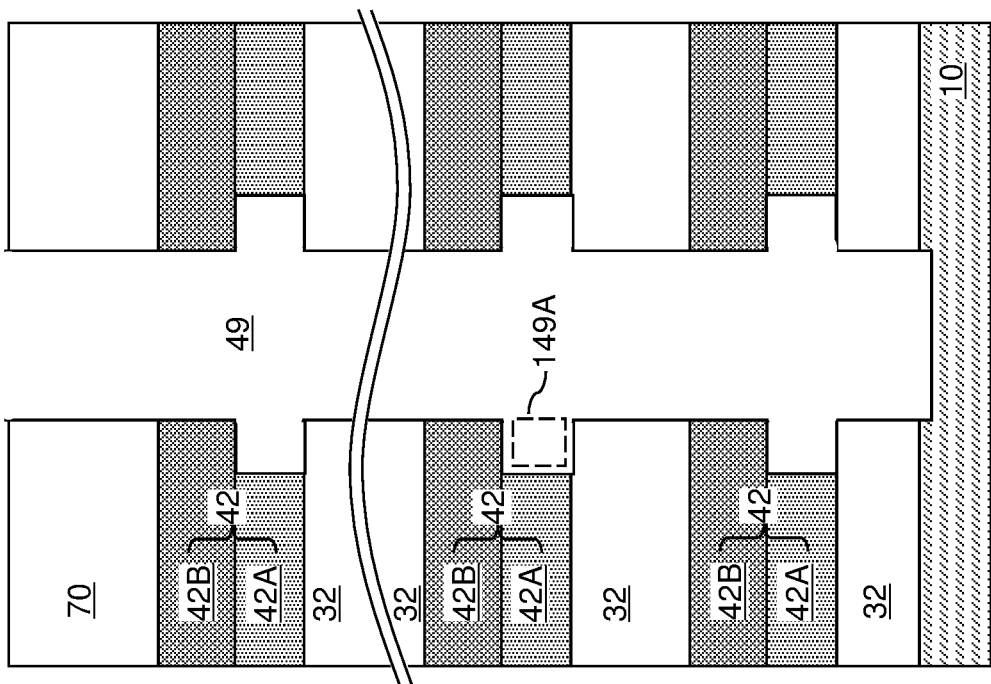

Referring to FIG. 8B, the processing steps of FIG. 6B can be performed to form the first ferroelectric material portion 54A within each first memory recess 149A.

Figure 8C:
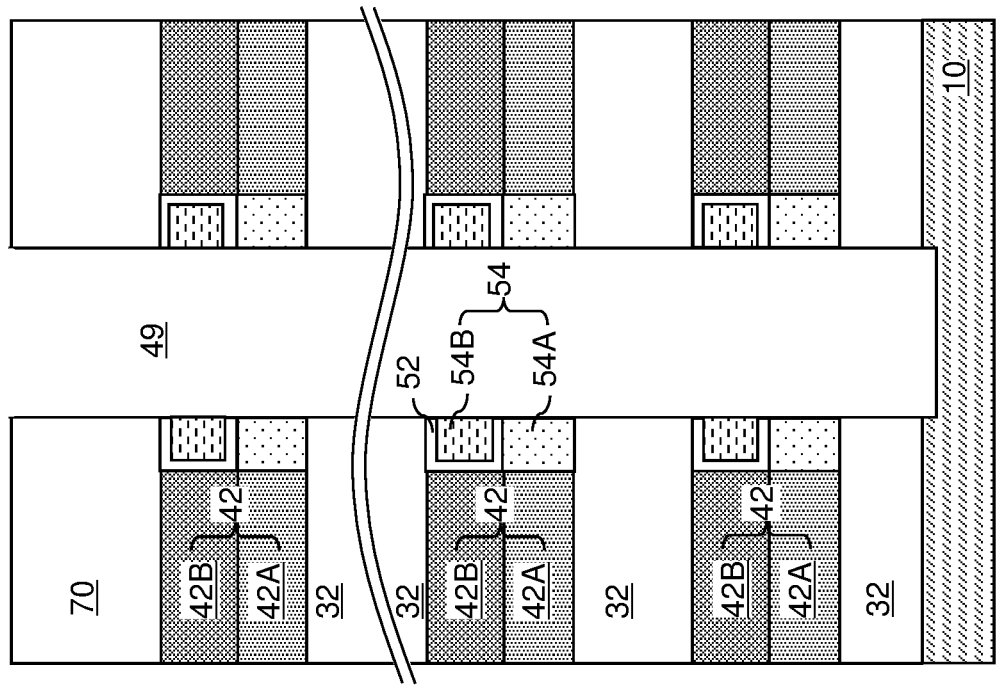

Referring to FIG. 8C, the processing steps of FIG. 6C can be performed to laterally recess the second-type sacrificial material layers 42B selective to the materials of the insulating layers 32 and the first ferroelectric material portions 54A. Second memory recesses 149B are formed in volumes formed by lateral recessing of the sidewalls of the second-type sacrificial material layers 42B relative to the insulating layers 32 and the first ferroelectric material portions 54A. Generally, the second memory recesses 149B can be formed after forming the first ferroelectric material portions 54A in the first memory recesses 149A by performing an isotropic etch process that etches the second sacrificial material selective to the first ferroelectric material portions 54A.

Figure 8D:
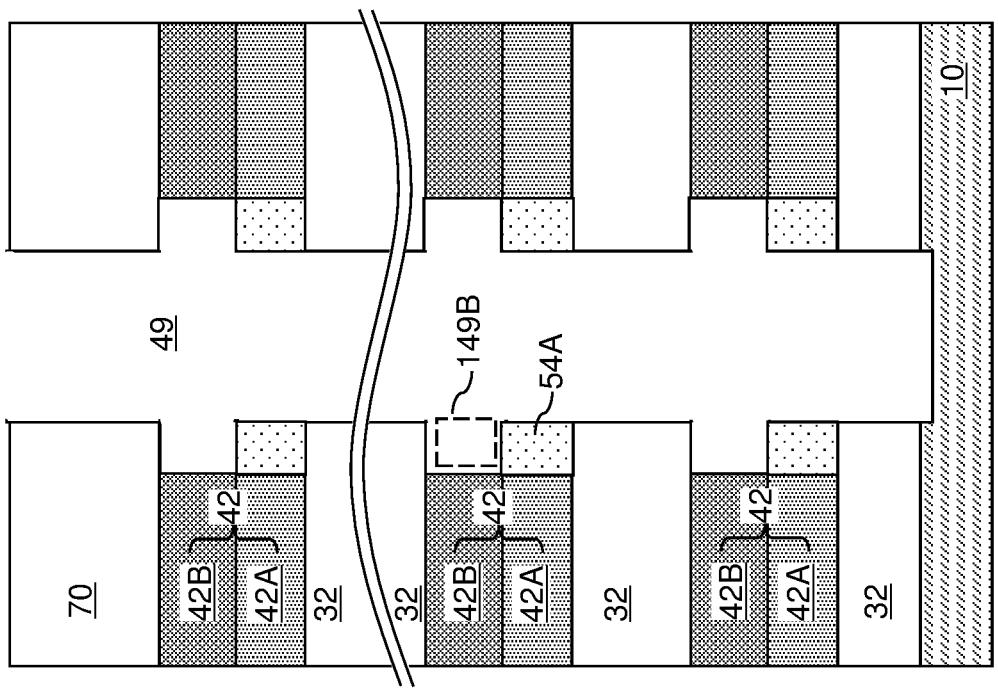

Referring to FIG. 8D, a dielectric liner layer including a non-ferroelectric dielectric material can be deposited on physically exposed surfaces of the exemplary structure by a conformal deposition process. In one embodiment, the dielectric liner layer includes a dielectric material such as silicon oxide and/or a dielectric metal oxide (e.g., aluminum oxide). The thickness of the dielectric liner layer can be in a range from 1 nm to 5 nm, although lesser and greater thicknesses may also be employed.

A second ferroelectric material can be deposited in the second memory recesses 149B by a conformal deposition process such as a chemical vapor deposition process. The second ferroelectric material may be any material that may be employed for the ferroelectric memory elements 54 as described above. Conformal deposition of the second ferroelectric material forms a second ferroelectric material layer.

An anisotropic etch process can be performed to remove portions of the second ferroelectric material layer located outside the second memory recesses 149B. Each remaining portion of the second ferroelectric material that remains in a second memory recess 149B comprises a second ferroelectric material portion 54B. In one embodiment, the second ferroelectric material portions 54B may comprise a different ferroelectric material than the first ferroelectric material portions 54A. In one embodiment, inner sidewalls of the first ferroelectric material portions 54A, inner sidewalls of the second ferroelectric material portions MB, and sidewalls of the insulating layers 32 around each memory opening 49 can be vertically coincident, i.e., may be located within a same cylindrical plane that extends vertically. Each contiguous combination of a first ferroelectric material portion 54A and a second ferroelectric material portion 54B comprises a ferroelectric memory element 54.

Each remaining portion of the dielectric liner layer located in a second memory recess 149B comprises a dielectric liner 52. Each dielectric liner 52 may have a clam-shaped vertical cross-sectional profile, and comprises a top annular portion, a bottom annular portion, and a cylindrical portion connecting an outer edge of the top annular portion to the bottom annular portion. Each dielectric liner 52 can contact, and laterally surround, a respective second ferroelectric material portion 54B.

Figure 8F:
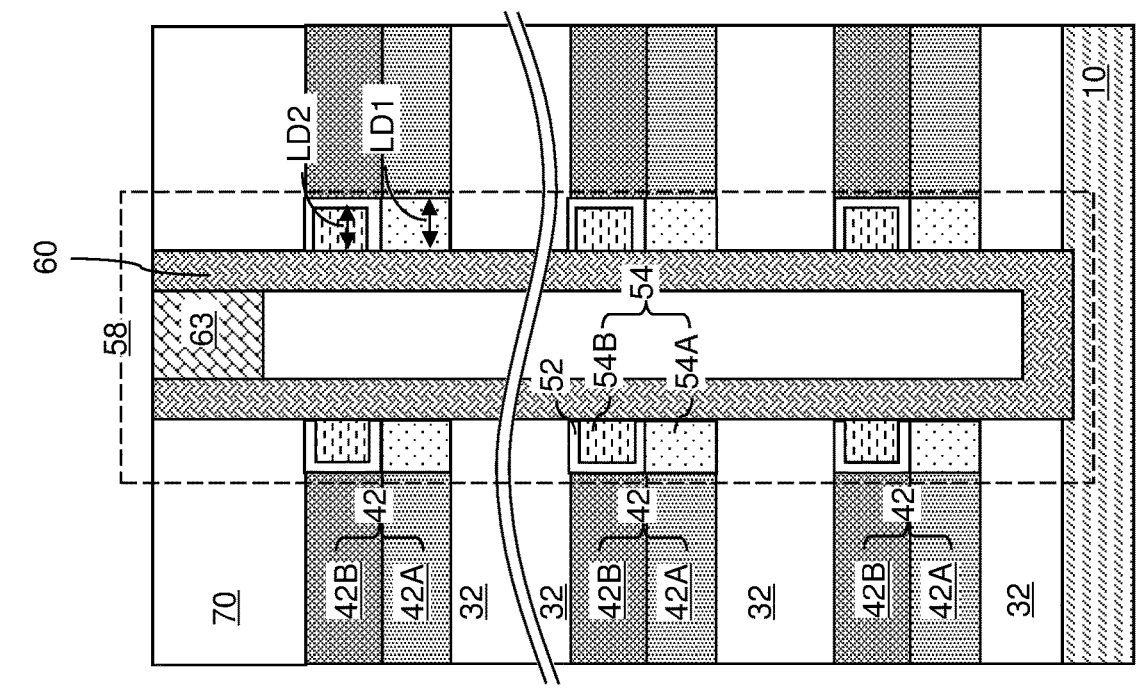
Figure 8E:
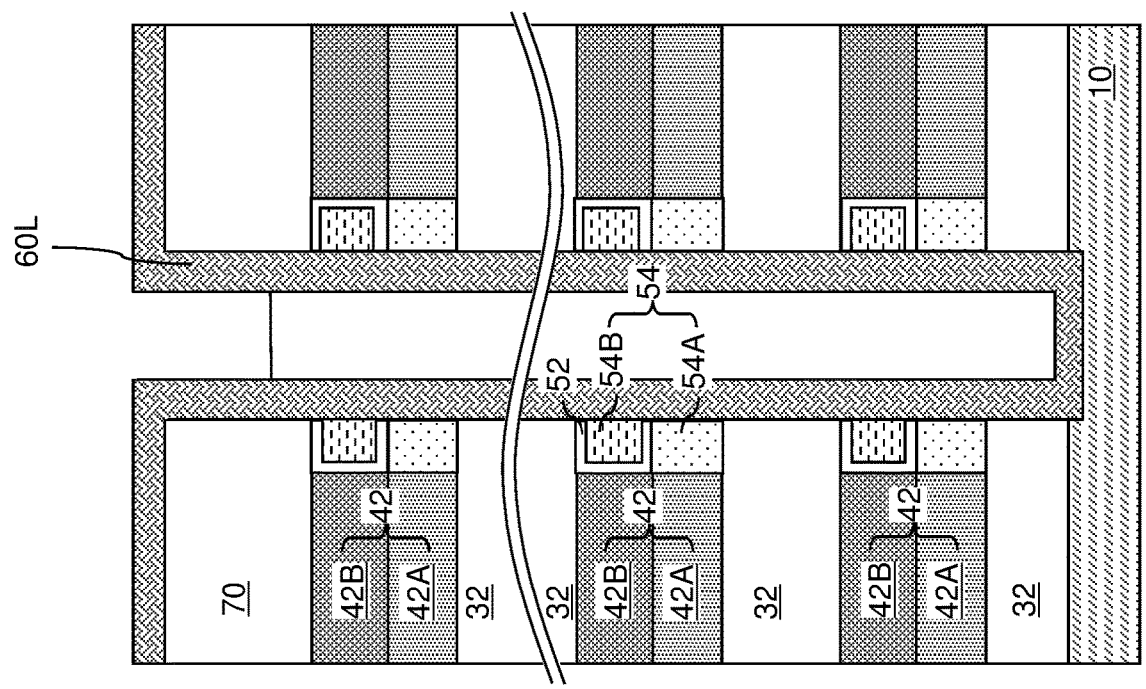

Referring to FIG. 8E, the processing steps of FIG. 5E can be performed to form a semiconductor channel layer 60L and dielectric cores 62.

Referring to FIG. 8F, the processing steps of FIG. 5F can be performed to form memory stack structures (54, 60) and drain regions 63.

FIGS. 9A-9F are sequential schematic vertical cross-sectional views of a memory opening within the exemplary structure during formation of a memory opening fill structure in a fifth configuration according to a fifth embodiment of the present disclosure.

Referring to FIG. 9A, the fifth configuration of a memory opening 49 can be the same as the third configuration of the memory opening 49 illustrated in FIG. 7A. Generally, first memory recesses 149A are formed in volumes formed by lateral recessing of the sidewalls of the first-type sacrificial material layers 42A relative to the sidewalls of the second-type sacrificial material layers 42B and the insulating layers 32.

The edge of the first-type sacrificial material layers 42A and the second-type sacrificial material layers 42B exposed in the memory opening are oxidized after forming the first memory recesses. If the first-type sacrificial material layers 42A and the second-type sacrificial material layers 42B comprise silicon nitride, then the oxidation forms a silicon oxynitride layer 152 on the surfaces of the first-type sacrificial material layers 42A and the second-type sacrificial material layers 42B exposed in the memory opening 49. The silicon oxynitride layer 152 is formed on the vertical edge surfaces of the first-type sacrificial material layers 42A and the second-type sacrificial material layers 42B exposed in the memory opening 49 and on the bottom annular horizontal surface of the second-type sacrificial material layers 42B exposed in the first memory recesses 149A

Referring to FIG. 9B, a first ferroelectric material can be deposited in unfilled volumes of the first memory recesses 149A by a conformal deposition process such as a chemical vapor deposition process. The first ferroelectric material may be any material that may be employed for the ferroelectric memory elements 54 (e.g., for the first ferroelectric material portions 54A) as described above. Conformal deposition of the first ferroelectric material forms a first ferroelectric material layer.

An anisotropic etch process can be performed to remove portions of the first ferroelectric material layer and the a silicon oxynitride layer 152 located outside the first memory recesses 149A. Each remaining portion of the first ferroelectric material that remains in a first memory recess 149A comprises a first ferroelectric material portion 54A. Each remaining portion of the a silicon oxynitride layer 152 located in a first memory recess 149A comprises a silicon oxynitride dielectric liner 52. Each dielectric liner 52 may have a horizontal annular portion and a cylindrical portion connected to an outer edge of the horizontal annular portion. Each dielectric liner 52 can contact, and laterally surround, a respective first ferroelectric material portion 54A.

Figure 9C:
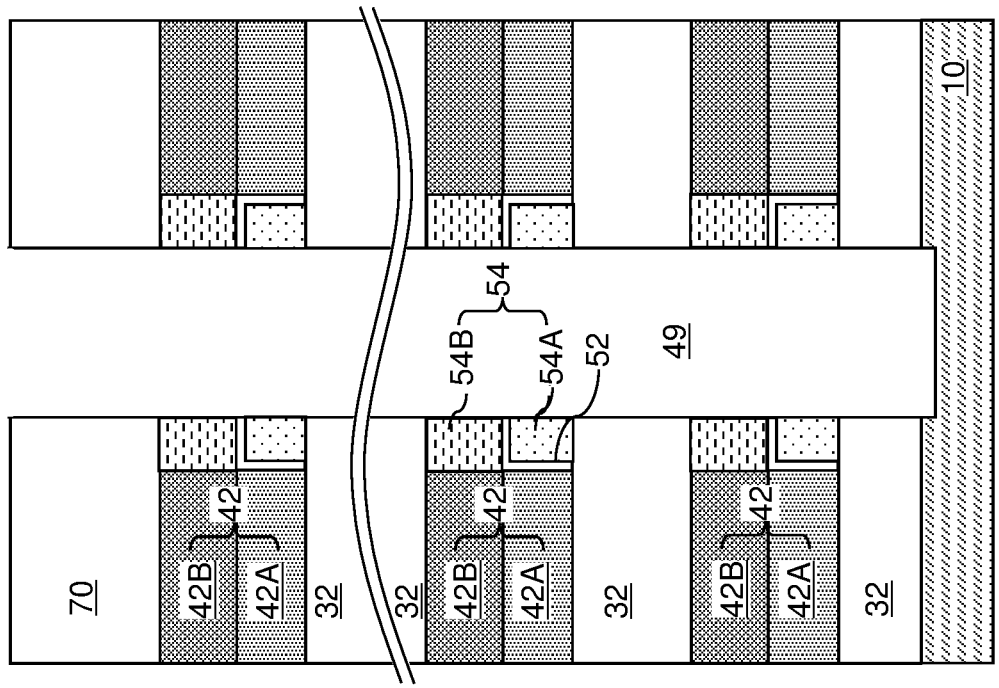

Referring to FIG. 9C, an isotropic etch process can be performed to laterally recess the second-type sacrificial material layers 42B selective to the materials of the insulating layers 32, the silicon oxynitride dielectric liner 52, and the first ferroelectric material portions 54A. For example, a wet etch process can be performed to isotropically recess the second sacrificial material of the second-type sacrificial material layers 42B. Second memory recesses 149B are formed in volumes formed by lateral recessing of the sidewalls of the second-type sacrificial material layers 42B relative to the insulating layers 32 and the first ferroelectric material portions 54A. Generally, the second memory recesses 149B can be formed after forming the first ferroelectric material portions 54A in the first memory recesses 149A by performing an isotropic etch process that etches the second sacrificial material selective to the first ferroelectric material portions 54A. The second memory recesses 149B may have the same or different width from the first memory recesses 149A.

Figure 9D:
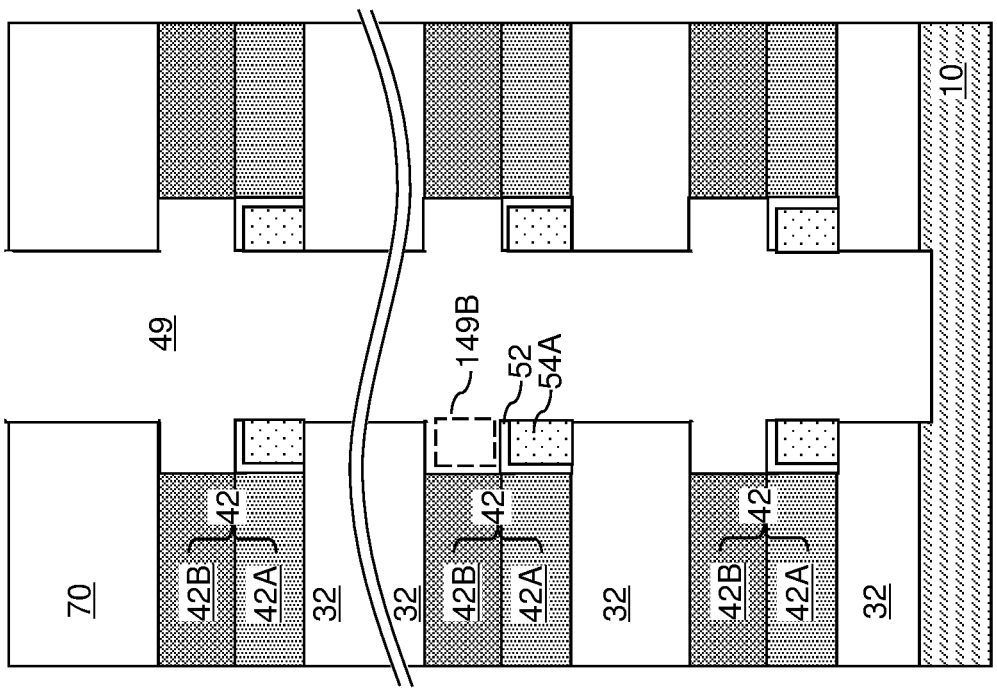

Referring to FIG. 9D, a second ferroelectric material can be deposited in the second memory recesses 149B by a conformal deposition process such as a chemical vapor deposition process. The second ferroelectric material may be any material that may be employed for the ferroelectric memory elements 54 (e.g., for the second ferroelectric material portions 54B) as described above. Conformal deposition of the second ferroelectric material forms a second ferroelectric material layer.

An anisotropic etch process can be performed to remove portions of the second ferroelectric material layer located outside the second memory recesses 149B. Each remaining portion of the second ferroelectric material that remains in a second memory recess 149B comprises a second ferroelectric material portion 54B. In one embodiment, the second ferroelectric material portions 54B may comprise a different ferroelectric material than the first ferroelectric material portions 54A. In one embodiment, inner sidewalls of the first ferroelectric material portions 54A, inner sidewalls of the second ferroelectric material portions MB, and sidewalls of the insulating layers 32 around each memory opening 49 can be vertically coincident, i.e., may be located within a same cylindrical plane that extends vertically. Each contiguous combination of a first ferroelectric material portion 54A and a second ferroelectric material portion 54B comprises a ferroelectric memory element 54.

Figure 9F:
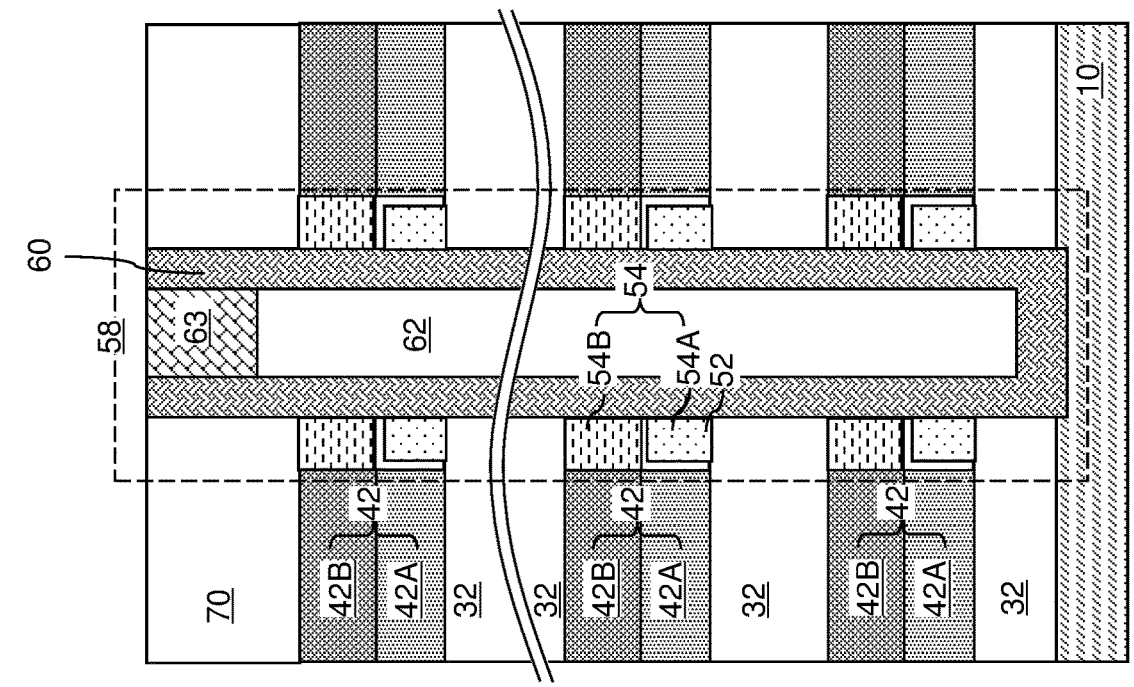
Figure 9E:
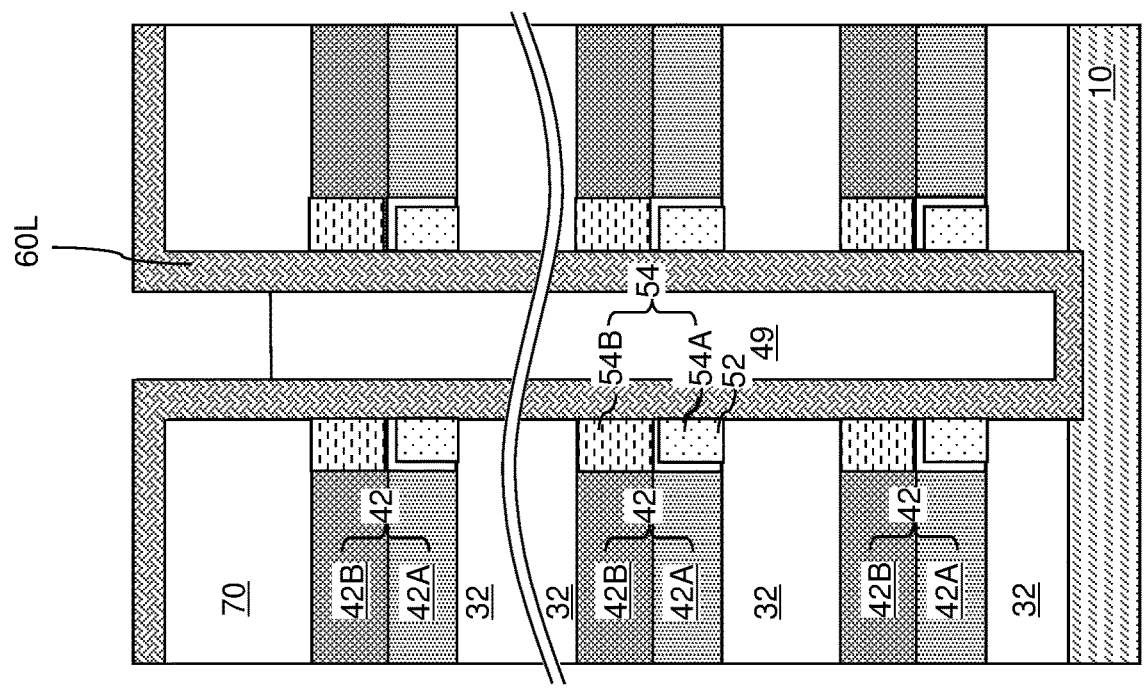

Referring to FIG. 9E, the processing steps of FIG. 5E can be performed to form a semiconductor channel layer 60L and dielectric cores 62.

Referring to FIG. 9F, the processing steps of FIG. 5F can be performed to form memory stack structures (54, 60) and drain regions 63.

Figure 10A:
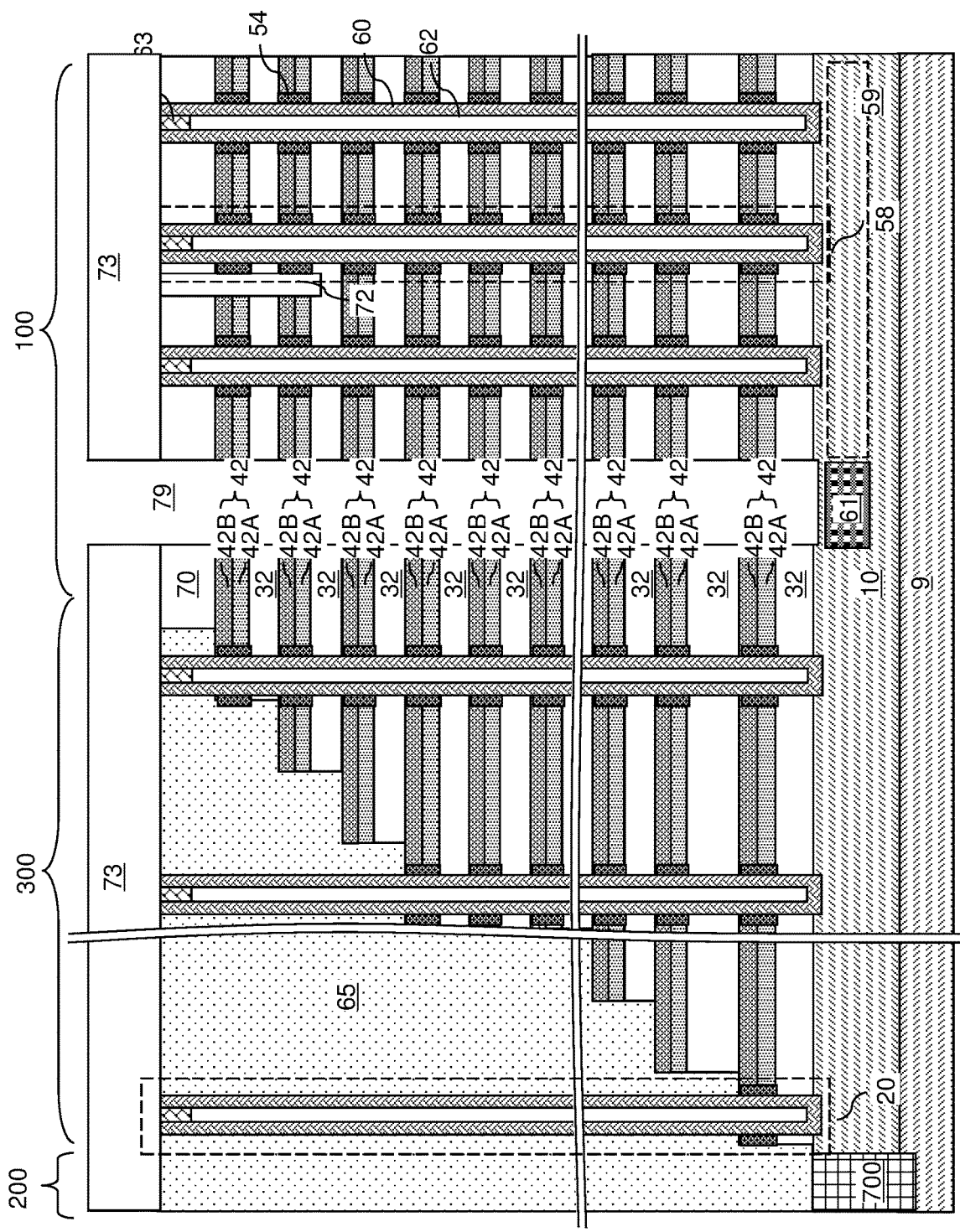
FIG. 10A is a schematic vertical cross-sectional view of the exemplary structure after formation of memory stack structures, support pillar structures and backside trenches according to an embodiment of the present disclosure.

Referring to FIG. 10A, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. Each memory stack structure (54, 60) includes a vertical semiconductor channel 60 and a vertical stack of ferroelectric memory elements 54.

Figure 10B:
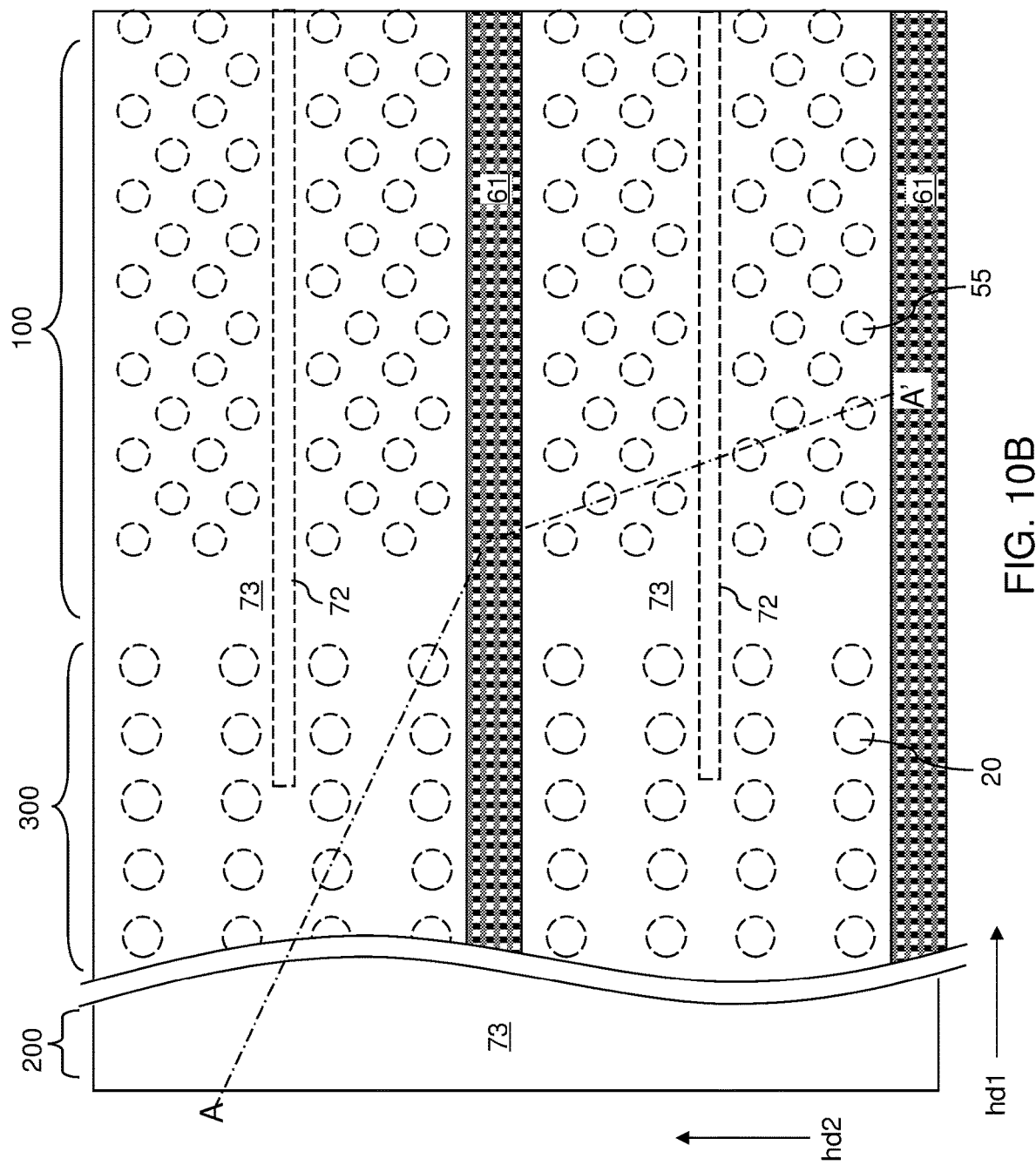
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, a contact level dielectric layer 73 can be formed over the alternating stack (32, 42) of insulating layer 32 and composite sacrificial material layers 42, and over the memory stack structures (54, 60) and the support pillar structures 20. The contact level dielectric layer 73 includes a dielectric material that is different from the dielectric material of the composite sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures (54, 60). The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures (54, 60) can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures (54, 60) can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside cavity 79' by implantation of electrical dopants into physically exposed surface portions of the semiconductor material layer 10. An upper portion of the semiconductor material layer 10 that extends between the source region 61 and vertical semiconductor channels 60 constitutes a horizontal semiconductor channel 59 for a plurality of field effect transistors.

Figure 11:
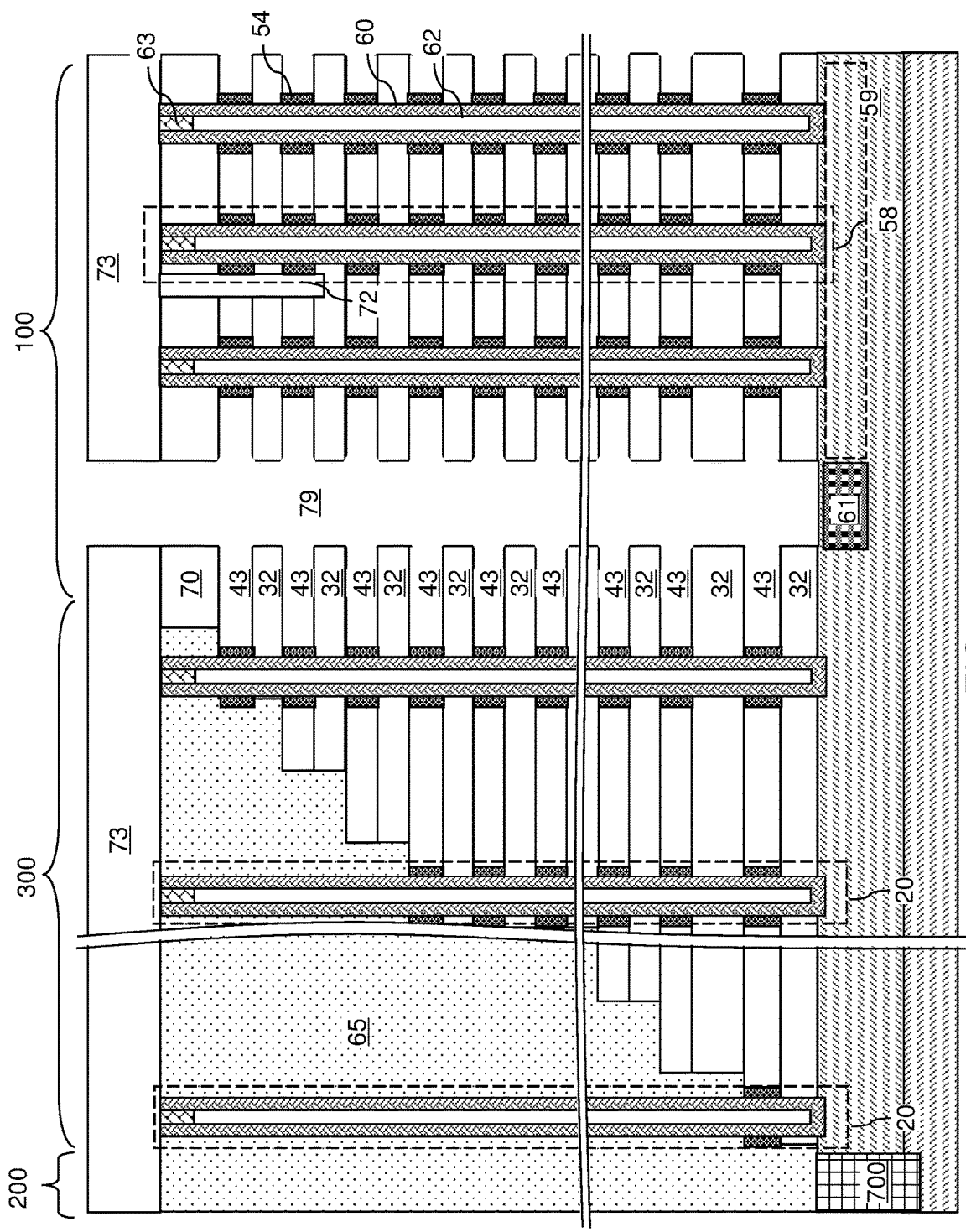
FIG. 11 is a schematic vertical cross-sectional view of the exemplary structure after formation of backside recesses according to an embodiment of the present disclosure.

Referring to FIG. 11, an etchant that selectively etches the second material of the composite sacrificial material layers 42 with respect to the first material of the insulating layers 32 can be introduced into the backside trenches 79, for example, employing an etch process. The first-type sacrificial material layers 42A and the second-type sacrificial material layers 42B can be removed by an isotropic etch process such as a wet etch process. In case the first-type sacrificial material layers 42A and the second-type sacrificial material layers 42B include silicon nitride materials, a wet etch process employing hot phosphoric acid can be performed to remove the first-type sacrificial material layers 42A and the second-type sacrificial material layers 42B.

Backside recesses 43 are formed in volumes from which the composite sacrificial material layers 42 are removed. The removal of the second material of the composite sacrificial material layers 42 can be selective to the first material of the insulating layers 32, the material of the retro-stepped dielectric material portion 65, the semiconductor material of the semiconductor material layer 10, and the ferroelectric material(s) of the ferroelectric memory elements 54. In one embodiment, the composite sacrificial material layers 42 can include silicon nitride, and the materials of the insulating layers 32 and the retro-stepped dielectric material portion 65 can be selected from silicon oxide and dielectric metal oxides. The support pillar structure 20, the retro-stepped dielectric material portion 65, and the memory stack structures (54, 60) provide structural support while the backside recesses 43 are present within volumes previously occupied by the composite sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the composite sacrificial material layers 42 is removed. The memory openings in which the memory stack structures (54, 60) are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 12:
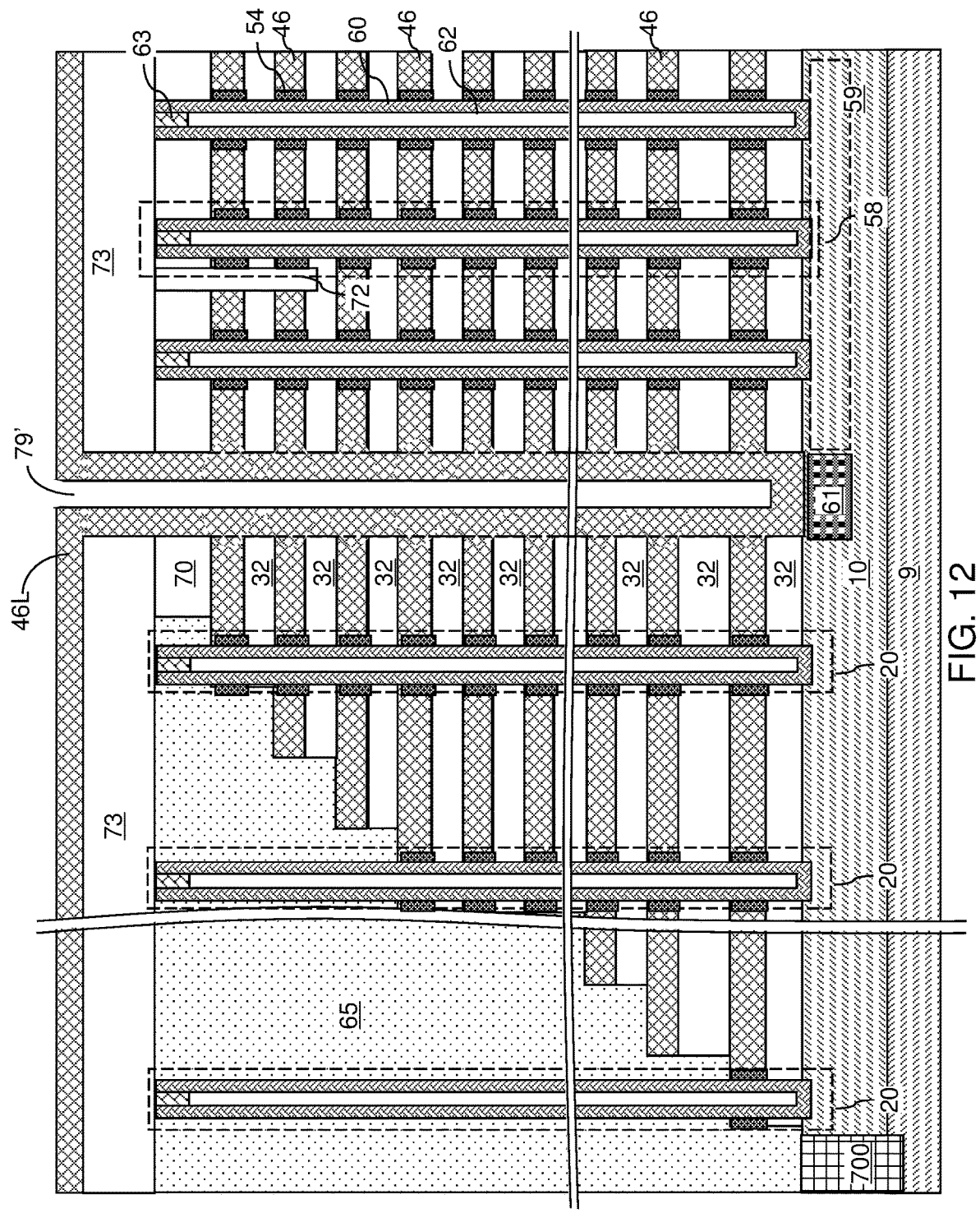
FIG. 12 is a schematic vertical cross-sectional view of the exemplary structure after formation of electrically conductive layers according to an embodiment of the present disclosure.
Figure 13A:
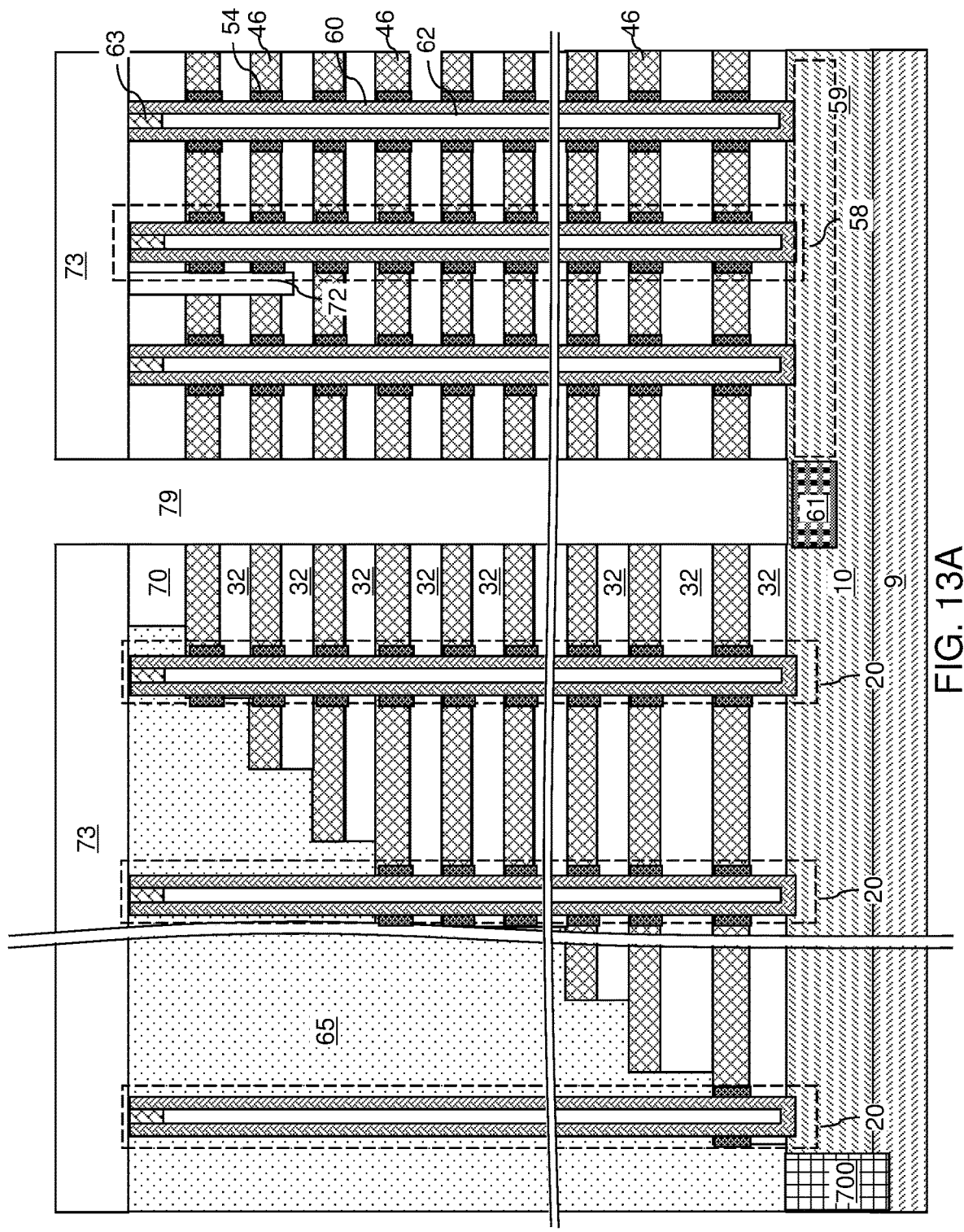
FIG. 13A is a schematic vertical cross-sectional view of the exemplary structure after removal of a deposited conductive material from within the backside trench according to an embodiment of the present disclosure.
Figure 13B:
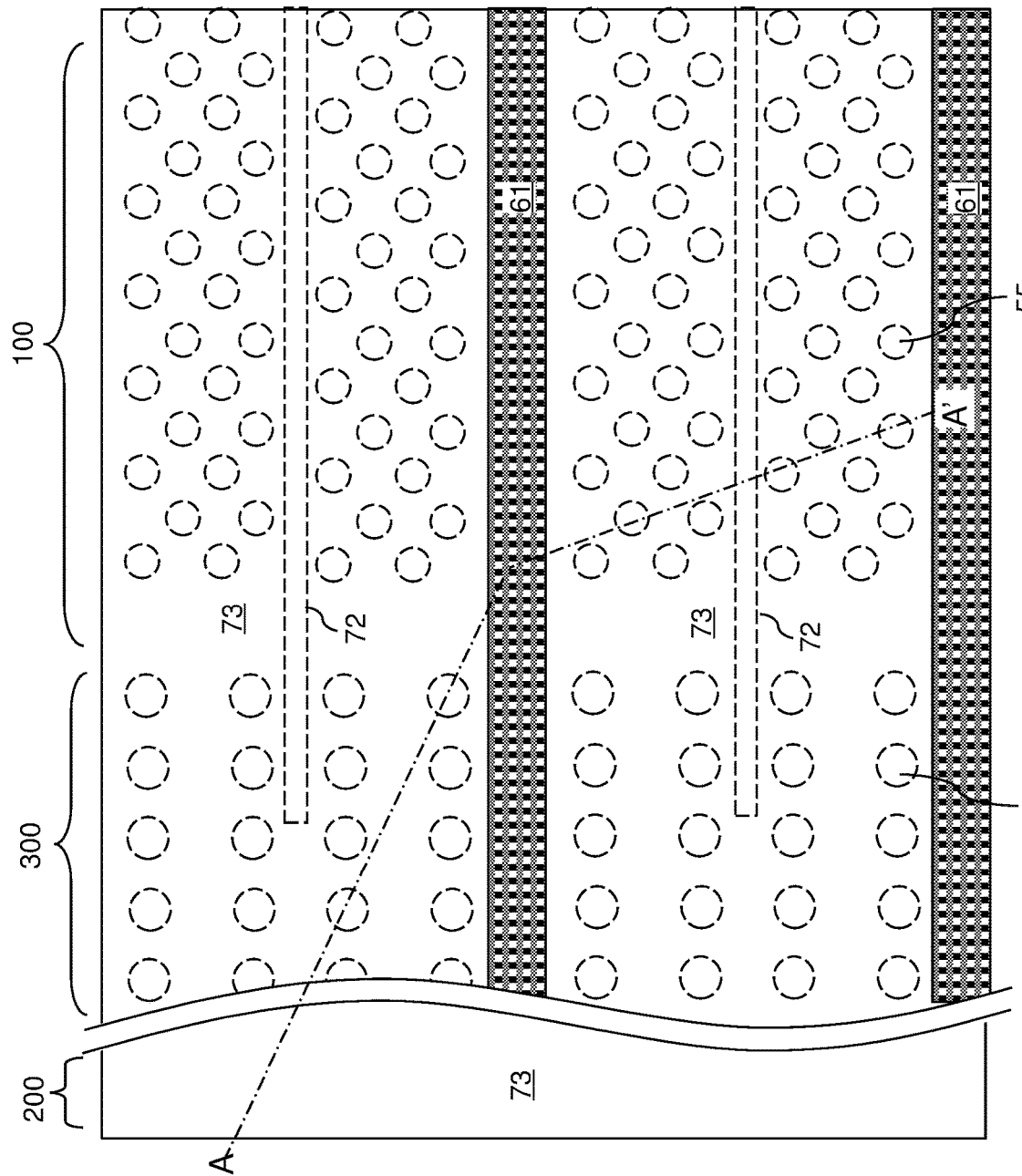
FIG. 13B is a partial see-through top-down view of the exemplary structure of FIG. 13A. The vertical plane A-A' is the plane of the schematic vertical cross-sectional view of FIG. 13A.

Referring to FIG. 12, at least one metallic material can be deposited in the backside recesses 43 by at least one conformal deposition process. In one embodiment, the at least one metallic material can include a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the contact level dielectric layer 73. Each composite sacrificial material layer 42 can be replaced with an electrically conductive layer 46. A backside cavity 79' is present in the portion of each backside trench 79 that is not filled with the continuous metallic material layer 46L.

Referring to FIGS. 13A, 13B, and 14A-14E, the deposited metallic material of the continuous metallic material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the composite sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures (54, 60). In other words, each electrically conductive layer 46 can be a word line that functions as a common control gate electrode for the plurality of vertical memory devices. One or more bottommost electrically conductive layers 46 can function as source side select gate electrodes, and or more topmost electrically conductive layers 46 can function as drain side select gate electrodes.

Figure 14A:
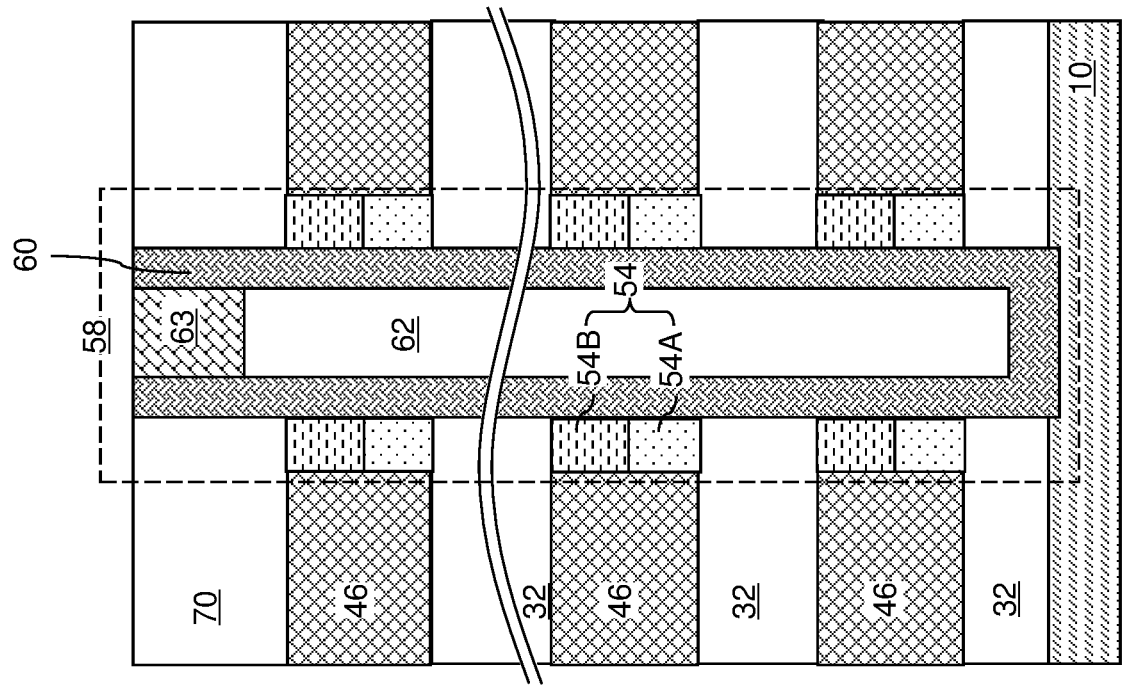
Figure 14B:
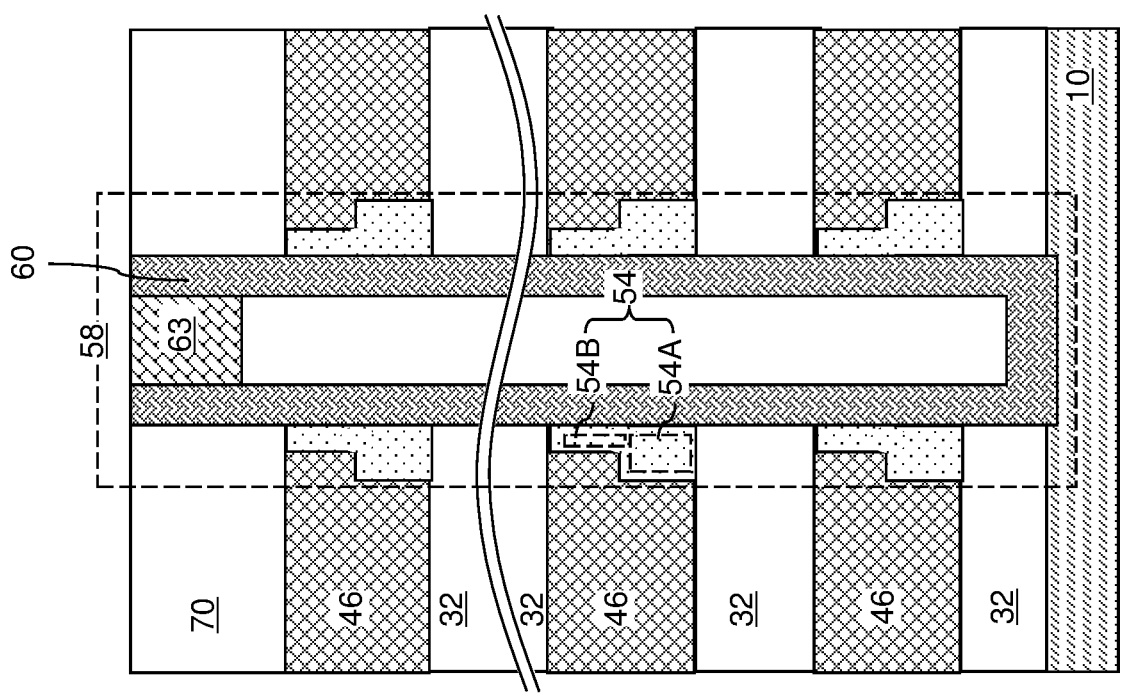
Figure 14E:
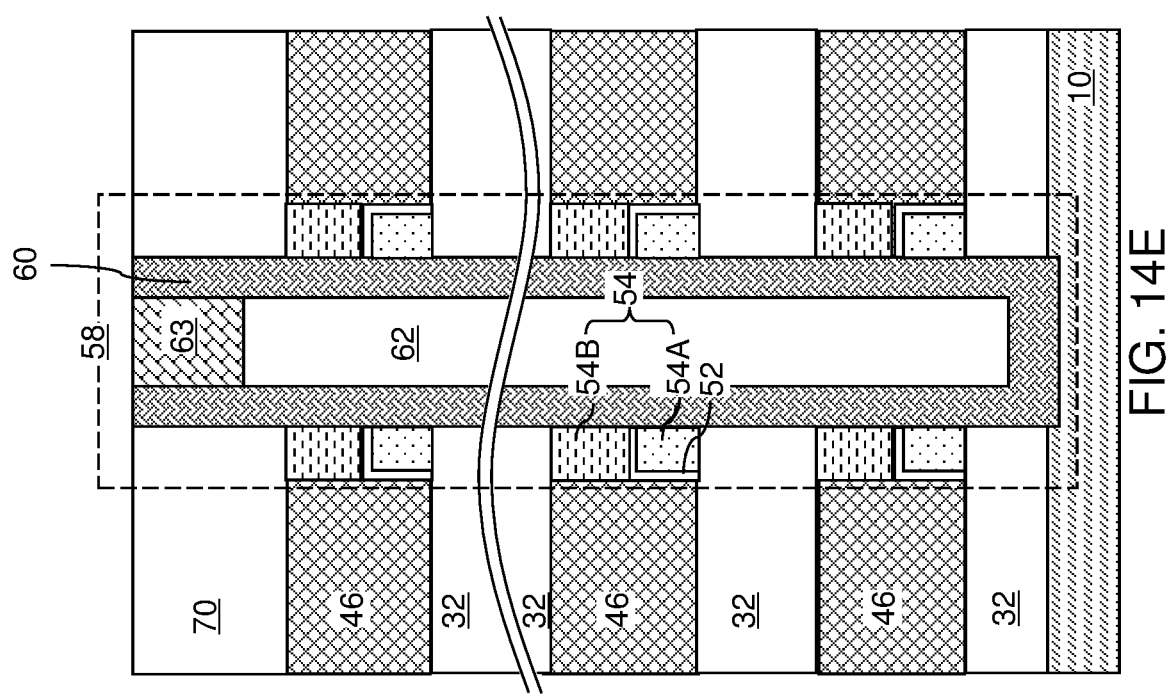

FIGS. 14A-14E illustrate various configurations of a memory opening fill structure 58. FIG. 14A illustrates a first configuration of the memory opening fill structure 58. FIG. 14B illustrates a second configuration of the memory opening fill structure 58. FIG. 14C illustrates a third configuration of the memory opening fill structure 58. FIG. 14D illustrates a fourth configuration of the memory opening fill structure 58. FIG. 14E illustrates a fifth configuration of the memory opening fill structure 58.

Figure 15:
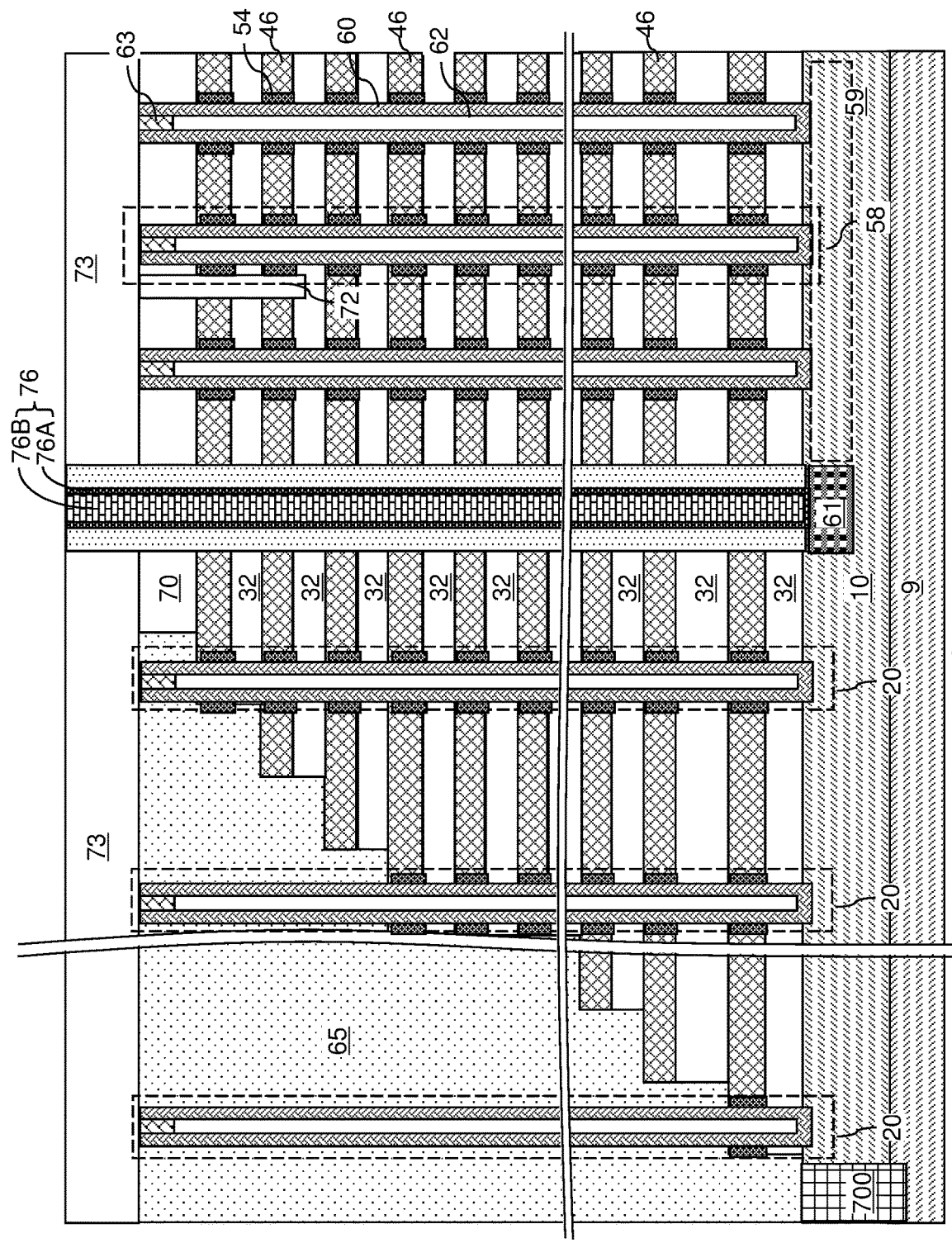
FIG. 15 is a schematic vertical cross-sectional view of the exemplary structure after formation of an insulating spacer and a backside contact structure according to an embodiment of the present disclosure.

Referring to FIG. 15, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 16A:
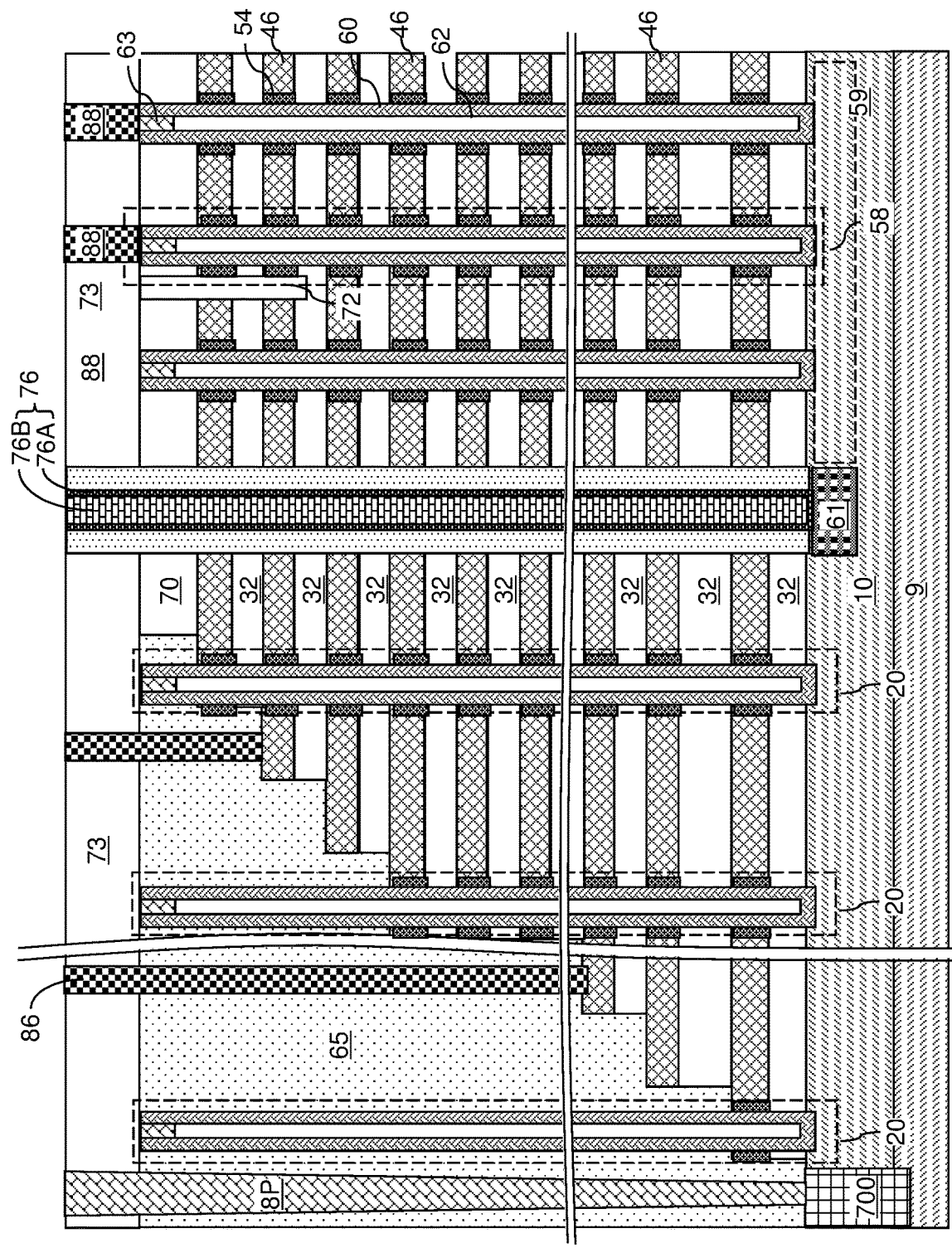
FIG. 16A is a schematic vertical cross-sectional view of the exemplary structure after formation of additional contact via structures according to an embodiment of the present disclosure.
Figure 16B:
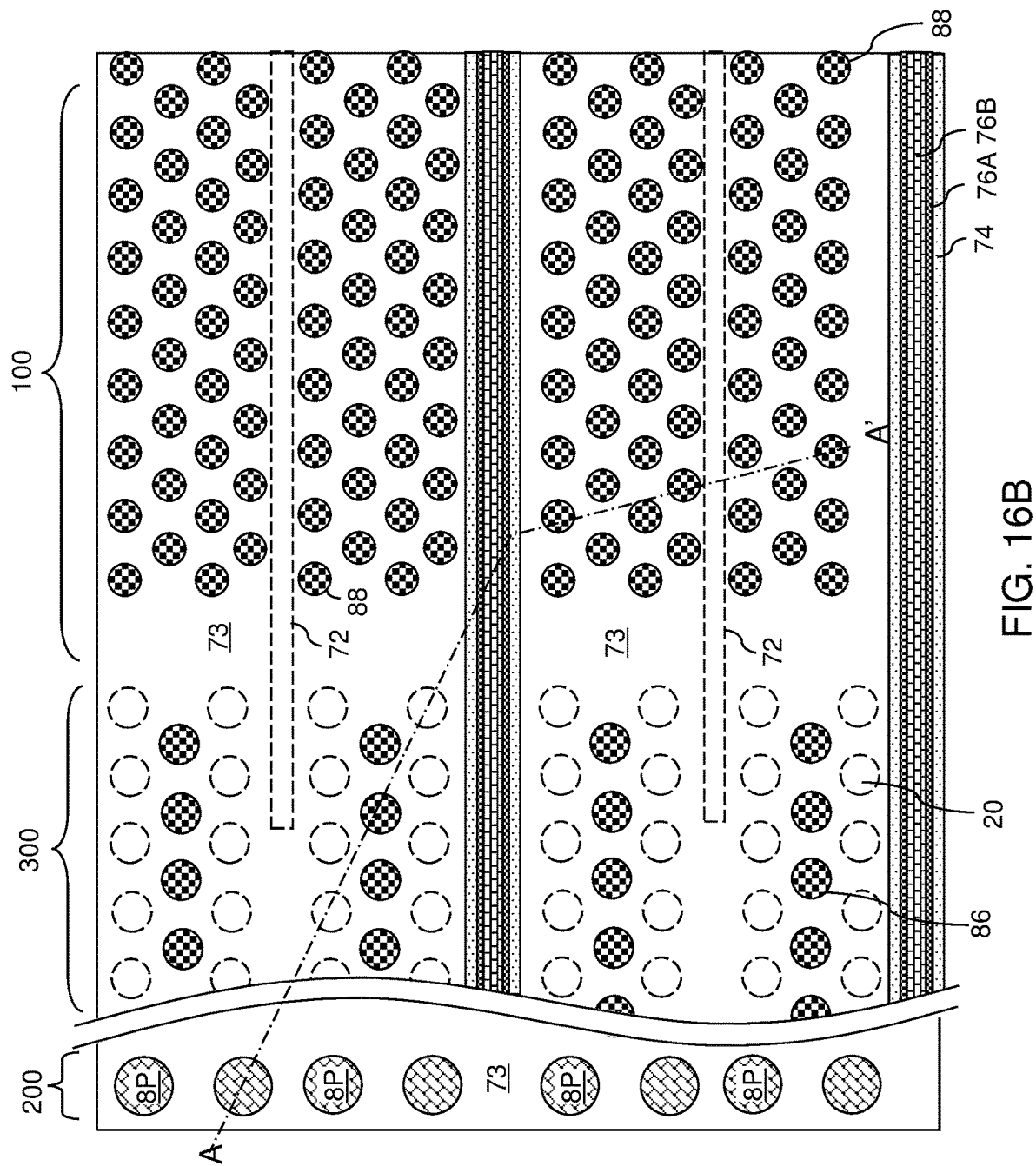
FIG. 16B is a top-down view of the exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 17:
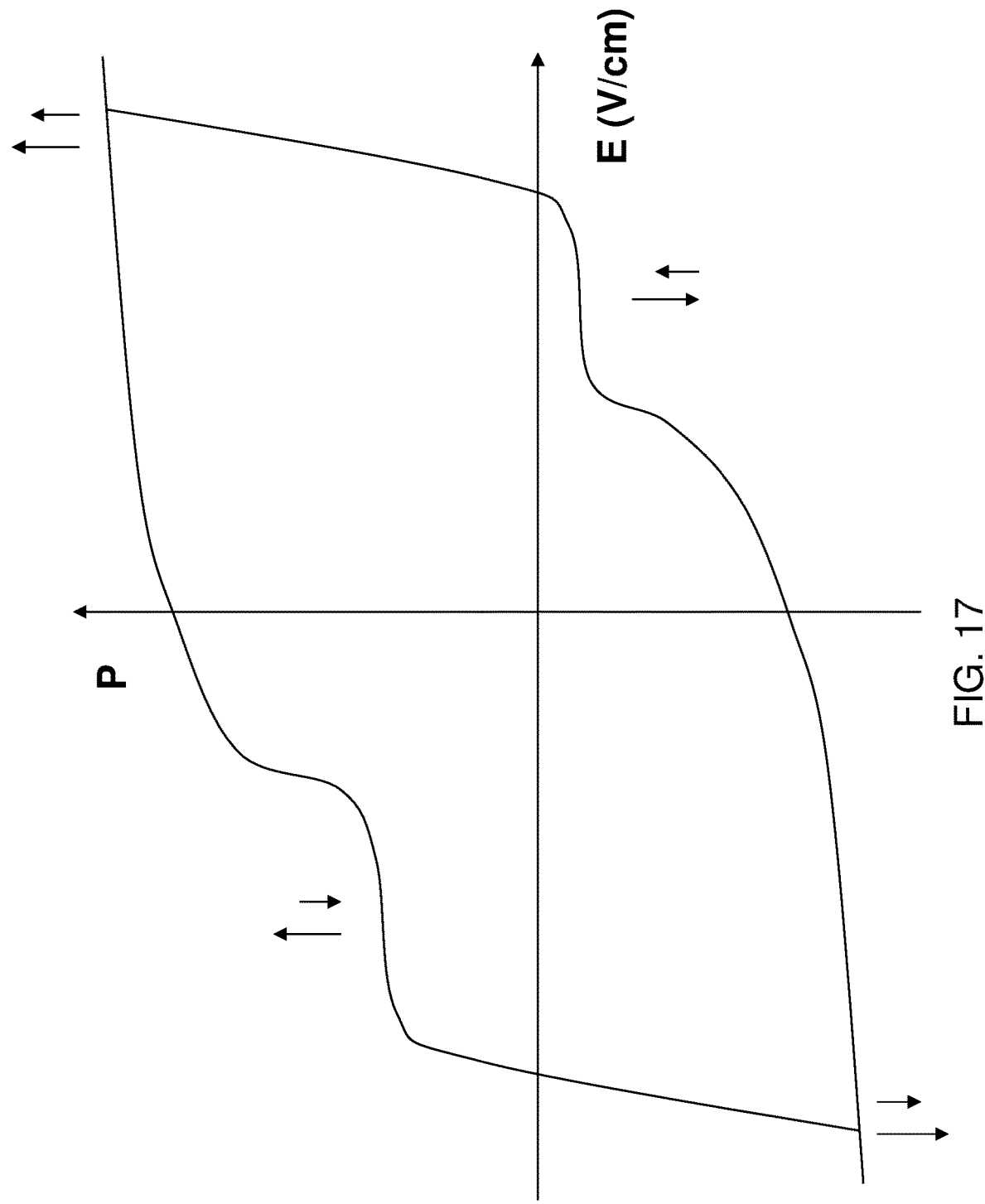
FIG. 17 is a schematic hysteresis curve of a ferroelectric memory element according to an embodiment of the present disclosure.

Referring to FIG. 17, a schematic hysteresis curve of a ferroelectric memory element 54 according to an embodiment of the present disclosure is shown. Generally, each of the ferroelectric memory elements 54 in a memory stack structure (54, 60) comprises a respective vertical stack of a first ferroelectric material portion 54A and a second ferroelectric material portion 54B that differs from the first ferroelectric material portion 54A by at least one of a material composition and a lateral thickness, i.e., a lateral dimension (LD1, LD2). The difference in the lateral thickness and/or the material composition between the first ferroelectric material portion 54A and the second ferroelectric material portion 54B causes difference in the coercivity and the remanent polarization between the first ferroelectric material portion 54A and the second ferroelectric material portion 54B. Further, the dielectric liners 52, if present, can be employed to differentiate the coercive field between the first ferroelectric material portion 54A and the second ferroelectric material portion 54B. The hysteresis curve of each ferroelectric memory element 54 may have more than two states of electrical polarization. Thus, each ferroelectric memory element 54 functions as a multibit (i.e., multi-level) memory element that is capable of storing three or more memory states, such as four memory states, depending on the electrical field (e.g., voltage) that is applied to an adjacent electrically conductive layer 46.

For example, at a first applied write (i.e., programming) voltage applied to an electrically conductive layer 46, only one of the ferroelectric material portions (54A or 54B) of an adjacent ferroelectric memory element 54 is turned "on" (e.g., set to a positive polarization state). At a second applied write (i.e., programming) voltage that is greater than the first applied write voltage that is applied to the same electrically conductive layer 46, both of the ferroelectric material portions (54A and 54B) of the adjacent ferroelectric memory element 54 are turned "on". The opposite polarity write voltages are used to turn "off" (e.g., reset to a negative polarization state) either one or both ferroelectric material portions of the same ferroelectric memory element 54. The ferroelectric memory element 54 thus has four polarization (i.e., memory) states (i.e., up-down, up-up, down-up and down-down) shown in FIG. 17.

Referring to all drawings and according to various embodiments of the present disclosure, a three-dimensional memory device comprises an alternating stack of insulating layers 32 and electrically conductive layers 46; and memory stack structures (54, 60) vertically extending through the alternating stack (32, 46). Each of the memory stack structures (54, 60) comprises a vertical semiconductor channel 60 and a vertical stack of ferroelectric memory elements 54 surrounding the vertical semiconductor channel 60 and located at levels of the electrically conductive layers 46. Each of the ferroelectric memory elements 54 comprises a respective vertical stack of a first ferroelectric material portion 54A and a second ferroelectric material portion 54B that differs from the first ferroelectric material portion 54A by at least one of a material composition and a lateral thickness.

In one embodiment, the vertical stack of ferroelectric memory elements 54 comprises a vertical stack of discrete, vertically separated ferroelectric memory elements, and the vertical semiconductor channel 60 has a straight outer sidewall that vertically extends through each layer within the alternating stack (32, 46). In one embodiment, each of the ferroelectric memory elements 54 contacts a bottom surface of a respective overlying one of the insulating layers 32 and a top surface of a respective overlying one of the insulating layers 32. In one embodiment, each of the ferroelectric memory elements 54 has a toroidal configuration and comprises a straight inner sidewall, an annular top surface, and an annular bottom surface.

In one embodiment, each of the ferroelectric memory elements 54 comprises a stepped outer sidewall including a first cylindrical surface that is laterally offset from the vertical semiconductor channel 60 by a first lateral distance LD1, a second cylindrical surface that is laterally offset from the vertical semiconductor channel 60 by a second lateral distance LD2, and an annular horizontal surface adjoined to an edge of the first cylindrical surface and adjoined to an edge of the second cylindrical surface. In one embodiment, the first ferroelectric material portion 54A and the second ferroelectric material portion 54B have a same material composition and different lateral thicknesses.

In one embodiment, the first ferroelectric material portion 54A and the second ferroelectric material portion 54B comprise different ferroelectric materials. In one embodiment, an outer sidewall of the first ferroelectric material portion 54A and an outer sidewall of the second ferroelectric material portion 54B contact a respective one of the electrically conductive layers 46. In one embodiment, one of an outer sidewall of the first ferroelectric material portion 54A and an outer sidewall of the second ferroelectric material portion 54B contacts a respective one of the electrically conductive layers 46; and another of the outer sidewall of the first ferroelectric material portion 54A and the outer sidewall of the second ferroelectric material portion 54B is laterally spaced from the respective one of the electrically conductive layers by a dielectric liner 52.

In one embodiment, a horizontal surface of the first ferroelectric material portion 54A and a horizontal surface of the second ferroelectric material portion 54B both contact the dielectric liner 52. In one embodiment, the first ferroelectric material portion 54A is vertically spaced from the second ferroelectric material portion 54B by a horizontally-extending portion of the dielectric liner 52. In one embodiment, the vertical semiconductor channel 60 of each of the memory stack structures (54, 60) laterally surrounds a respective dielectric core 62 and comprises an end portion contacting a drain region 63.

In one embodiment, each ferroelectric memory element 54 within the vertical stack of ferroelectric memory elements 54 has a top surface that is coplanar with an interface between one of the electrically conductive layers 46 and an overlying one of the insulating layers 32, and has a bottom surface that is coplanar with an interface between the one of the electrically conductive layers 46 and an underlying one of the insulating layers 32.

Generally, the first ferroelectric material portion 54A and the second ferroelectric material portion 54B of the same ferroelectric memory element 54 can be polarized at different applied write voltage ranges (i.e., have different polarization states) to form a multi-level cell (MLC) comprising the ferroelectric memory element 54. In one embodiment, one of the first ferroelectric material portion 54A and the second ferroelectric material portion 54B may comprise, and/or may consist essentially of, same or different doped hafnium oxide-based materials, lead zirconate titanate (PZT), or strontium bismuth tantalate (SBT). In case dielectric liners 52 are employed, the dielectric liners 52 can adjust the write voltage range for a ferroelectric material that contacts the dielectric liner 52.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers; and
memory stack structures vertically extending through the alternating stack,
wherein:
each of the memory stack structures comprises a vertical semiconductor channel and a vertical stack of ferroelectric memory elements surrounding the vertical semiconductor channel and located at levels of the electrically conductive layers; and
each of the ferroelectric memory elements comprises a respective vertical stack of a first ferroelectric material portion and a second ferroelectric material portion that differs from the first ferroelectric material portion by a lateral thickness.

2. The three-dimensional memory device of claim 1, wherein:
the vertical stack of ferroelectric memory elements comprises a vertical stack of discrete, vertically separated ferroelectric memory elements; and
the vertical semiconductor channel has a straight outer sidewall that vertically extends through each layer within the alternating stack.

3. The three-dimensional memory device of claim 1, wherein each of the ferroelectric memory elements contacts a bottom surface of a respective overlying one of the insulating layers and a top surface of a respective overlying one of the insulating layers.

4. The three-dimensional memory device of claim 1, wherein each of the ferroelectric memory elements has a toroidal configuration and comprises a straight inner sidewall, an annular top surface, and an annular bottom surface.

5. The three-dimensional memory device of claim 1, wherein the first ferroelectric material portion and the second ferroelectric material portion have a same material composition and the different lateral thicknesses.

6. The three-dimensional memory device of claim 5, wherein each of the ferroelectric memory elements comprises a stepped outer sidewall including a first cylindrical surface that is laterally offset from the vertical semiconductor channel by a first lateral distance, a second cylindrical surface that is laterally offset from the vertical semiconductor channel by a second lateral distance, and an annular horizontal surface adjoined to an edge of the first cylindrical surface and adjoined to an edge of the second cylindrical surface.

7. The three-dimensional memory device of claim 1, wherein the first ferroelectric material portion and the second ferroelectric material portion comprise different ferroelectric materials.

8. The three-dimensional memory device of claim 7, wherein an outer sidewall of the first ferroelectric material portion and an outer sidewall of the second ferroelectric material portion contact a respective one of the electrically conductive layers.

9. The three-dimensional memory device of claim 7, wherein:
one of an outer sidewall of the first ferroelectric material portion and an outer sidewall of the second ferroelectric material portion contacts a respective one of the electrically conductive layers; and
another of the outer sidewall of the first ferroelectric material portion and the outer sidewall of the second ferroelectric material portion is laterally spaced from the respective one of the electrically conductive layers by a dielectric liner.

10. The three-dimensional memory device of claim 9, wherein a horizontal surface of the first ferroelectric material portion and a horizontal surface of the second ferroelectric material portion both contact the dielectric liner.

11. The three-dimensional memory device of claim 10, wherein the first ferroelectric material portion is vertically spaced from the second ferroelectric material portion by a horizontally-extending portion of the dielectric liner.

12. The three-dimensional memory device of claim 1, wherein the vertical semiconductor channel of each of the memory stack structures laterally surrounds a respective dielectric core and comprises an end portion contacting a drain region.

13. The three-dimensional memory device of claim 1, wherein each ferroelectric memory element within the vertical stack of ferroelectric memory elements has a top surface that is coplanar with an interface between one of the electrically conductive layers and an overlying one of the insulating layers, and has a bottom surface that is coplanar with an interface between the one of the electrically conductive layers and an underlying one of the insulating layers.

14. A method of forming a semiconductor structure, comprising:
forming multiple repetitions of a unit layer stack over a substrate, the unit layer stack comprising an insulating layer, a first-type sacrificial material layer comprising a first sacrificial material, and a second-type sacrificial material layer comprising a second sacrificial material different from the first sacrificial material;
forming memory openings through the multiple repetitions of the unit layer stack;
forming first memory recesses by isotropically recessing instances of the first-type sacrificial material layers around the memory openings;
forming first ferroelectric material portions in the first memory recesses;
forming second memory recesses by isotropically recessing instances of the second-type sacrificial material layers around the memory openings;
forming second ferroelectric material portions in the second memory recesses, wherein ferroelectric memory elements including a respective one of the first ferroelectric material portions and a respective one of the second ferroelectric material portions are formed; and
forming vertical semiconductor channels in the memory openings on a respective vertical stack of the ferroelectric memory elements.

15. The method of claim 14, wherein the first memory recesses and the second memory recesses are formed simultaneously by performing an isotropic etch process that etches the first sacrificial material and the second sacrificial material at different etch rates.

16. The method of claim 15, further comprising:
depositing a ferroelectric material layer within each of the first memory recesses and the second memory recesses and on sidewalls of each instance of the insulating layer by performing a conformal deposition process; and
anisotropically etching portions of the ferroelectric material layer from inside the memory openings and from above the multiple repetitions of the unit layer stack, wherein each remaining portion of the ferroelectric material layer comprises one of the ferroelectric memory elements.

17. The method of claim 14, wherein the second memory recesses are formed after forming the first ferroelectric material portions in the first memory recesses by performing an isotropic etch process that etches the second sacrificial material selective to the first ferroelectric material portions.

18. The method of claim 17, wherein:
the first memory recesses are formed by performing an isotropic etch process that etches the first sacrificial material at a higher etch rate than the second sacrificial material; and
the first ferroelectric material portions are formed by depositing a first ferroelectric material layer in the first memory recesses and by anisotropically etching the first ferroelectric material layer.

19. The method of claim 17, further comprising:
forming a dielectric liner layer in the first memory recesses prior to deposition of the first ferroelectric material or in the second memory recesses prior to deposition of the second ferroelectric material; and
anisotropically etching the dielectric liner layer, wherein remaining portions of the dielectric liner layer comprise dielectric liners contacting a respective one of the first ferroelectric material portions or a respective one of the second ferroelectric material portions.

20. The method of claim 14, further comprising replacing remaining portions of the first-type sacrificial material layers and second-type sacrificial material layers with electrically conductive layers, wherein the second ferroelectric material portion differs from the first ferroelectric material portion by at least one of a material composition and a lateral thickness.

21. A three-dimensional memory device comprising:
an alternating stack of insulating layers and electrically conductive layers; and
memory stack structures vertically extending through the alternating stack,
wherein:
each of the memory stack structures comprises a vertical semiconductor channel and a vertical stack of ferroelectric memory elements surrounding the vertical semiconductor channel and located at levels of the electrically conductive layers; and
each of the ferroelectric memory elements comprises a respective vertical stack of a first ferroelectric material portion and a second ferroelectric material portion that differs from the first ferroelectric material portion by at least one of a material composition and a lateral thickness,
wherein:
one of an outer sidewall of the first ferroelectric material portion and an outer sidewall of the second ferroelectric material portion contacts a respective one of the electrically conductive layers; and
another of the outer sidewall of the first ferroelectric material portion and the outer sidewall of the second ferroelectric material portion is laterally spaced from the respective one of the electrically conductive layers by a dielectric liner.

22. The three-dimensional memory device of claim 21, wherein:
a horizontal surface of the first ferroelectric material portion and a horizontal surface of the second ferroelectric material portion both contact the dielectric liner; and
the first ferroelectric material portion is vertically spaced from the second ferroelectric material portion by a horizontally-extending portion of the dielectric liner.

23. The three-dimensional memory device of claim 21, wherein the first ferroelectric material portion and the second ferroelectric material portion have the different lateral thicknesses.

24. The three-dimensional memory device of claim 21, wherein the first ferroelectric material portion and the second ferroelectric material portion comprise the different ferroelectric materials.

* * * * *